(12) United States Patent
Chung et al.

(10) Patent No.: US 12,363,904 B2
(45) Date of Patent: Jul. 15, 2025

(54) THREE-DIMENSIONAL SEMICONDUCTOR MEMORY DEVICE AND ELECTRONIC SYSTEM INCLUDING THE SAME

(71) Applicant: SAMSUNG ELECTRONICS CO., LTD., Suwon-si (KR)

(72) Inventors: Giyong Chung, Seoul (KR); Jae-Bok Baek, Osan-si (KR); Jaeryong Sim, Suwon-si (KR); Jeehoon Han, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 468 days.

(21) Appl. No.: 17/541,444

(22) Filed: Dec. 3, 2021

(65) Prior Publication Data

US 2022/0328511 A1 Oct. 13, 2022

(30) Foreign Application Priority Data

Apr. 9, 2021 (KR) .................. 10-2021-0046501

(51) Int. Cl.
*H10B 43/40* (2023.01)
*H01L 23/535* (2006.01)
*H10B 41/27* (2023.01)
*H10B 41/41* (2023.01)
*H10B 43/27* (2023.01)

(52) U.S. Cl.
CPC ........... *H10B 43/40* (2023.02); *H01L 23/535* (2013.01); *H10B 41/27* (2023.02); *H10B 41/41* (2023.02); *H10B 43/27* (2023.02)

(58) Field of Classification Search
CPC ........ H10B 43/40; H10B 41/27; H10B 41/41; H10B 43/27; H10B 43/50; H10B 43/20; H10B 43/35; H01L 23/535; H01L 25/0657; H10D 84/0149
See application file for complete search history.

(56) References Cited

U.S. PATENT DOCUMENTS

| 8,178,917 | B2 | 5/2012 | Tanaka et al. |
| 2020/0251487 | A1* | 8/2020 | Tang ................. H01L 21/02282 |
| 2021/0335811 | A1* | 10/2021 | Chung .................. H10B 41/27 |

(Continued)

FOREIGN PATENT DOCUMENTS

| CN | 107564913 A | 1/2018 |
| CN | 107706183 A | 2/2018 |
| CN | 109065545 A | 12/2018 |

(Continued)

*Primary Examiner* — Yasser A Abdelaziz
(74) *Attorney, Agent, or Firm* — Muir Patent Law, PLLC

(57) ABSTRACT

A three-dimensional semiconductor memory device includes a first substrate, a peripheral circuit structure with peripheral transistors on the first substrate, a second substrate on the peripheral circuit structure, a lower insulating layer in contact with a side surface of the second substrate, a top surface of the lower insulating layer having a concave profile, a first stack on the second substrate, the first stack including repeatedly alternating first interlayer dielectric layers and gate electrodes, and a first mold structure on the lower insulating layer, the first mold structure including repeatedly alternating sacrificial layers and second interlayer dielectric layers, and a top surface of the first mold structure being at a level lower than a topmost surface of the first stack.

20 Claims, 20 Drawing Sheets

(56) References Cited

U.S. PATENT DOCUMENTS

2022/0223614 A1\* 7/2022 Takuma ................ H10B 41/10

FOREIGN PATENT DOCUMENTS

| CN | 111199976 A | 5/2020 |
| KR | 10-2020-0038323 A | 4/2020 |
| KR | 10-2020-0132136 A | 11/2020 |
| KR | 20210012772 | \* 2/2021 |

\* cited by examiner

THREE-DIMENSIONAL SEMICONDUCTOR MEMORY DEVICE AND ELECTRONIC SYSTEM INCLUDING THE SAME

CROSS-REFERENCE TO RELATED APPLICATION

This U.S. non-provisional patent application claims priority under 35 U.S.C. § 119 to Korean Patent Application No. 10-2021-0046501, filed on Apr. 9, 2021, in the Korean Intellectual Property Office, the entire contents of which are hereby incorporated by reference.

BACKGROUND

1. Field

The present disclosure relates to a three-dimensional semiconductor memory device and an electronic system including the same, and in particular, a nonvolatile three-dimensional semiconductor memory device including a vertical channel structure, a method of fabricating the same, and an electronic system including the same.

2. Description of the Related Art

A semiconductor device capable of storing a large amount of data is required as a part of an electronic system. Higher integration of semiconductor devices is required to satisfy consumer demands for large data storing capacity, superior performance, and inexpensive prices. In the case of two-dimensional or planar semiconductor devices, since their integration is mainly determined by the area occupied by a unit memory cell, integration is greatly influenced by the level of a fine pattern forming technology. However, the extremely expensive process equipment needed to increase pattern fineness sets a practical limitation on increasing integration for two-dimensional or planar semiconductor devices. Thus, three-dimensional semiconductor memory devices including three-dimensionally arranged memory cells have recently been proposed.

SUMMARY

According to an embodiment, a three-dimensional semiconductor memory device may include a first substrate, a peripheral circuit structure including peripheral transistors provided on the first substrate, a second substrate provided on the peripheral circuit structure, a lower insulating layer in contact with a side surface of the second substrate, a first stack including interlayer dielectric layers and gate electrodes, which are alternately and repeatedly stacked on the second substrate, and a first mold structure including sacrificial layers and interlayer dielectric layers, which are alternately and repeatedly stacked on the lower insulating layer. A top surface of the lower insulating layer may have a concave profile, and a top surface of the first mold structure may be located at a level lower than the topmost surface of the first stack.

According to an embodiment, a three-dimensional semiconductor memory device may include a first substrate including a cell array region, a contact region, and a peripheral region, a peripheral circuit structure including peripheral transistors provided on the first substrate, a second substrate provided on the peripheral circuit structure and extended from the cell array region to the contact region, a lower insulating layer provided on the peripheral region to be in contact with a side surface of the second substrate, a stack including interlayer dielectric layers and gate electrodes, which are alternately and repeatedly stacked on the second substrate, a source structure extended in a horizontal direction, between the second substrate and the stack, a mold structure including sacrificial layers and interlayer dielectric layers, which are alternately and repeatedly stacked on the lower insulating layer, a planarization insulating layer covering the stack and the mold structure, a plurality of vertical channel structures, which are provided on the cell array region and the contact region to penetrate the planarization insulating layer, the stack, and the source structure and to be in contact with the second substrate, a plurality of cell contact plugs, which re provided on the contact region to penetrate the planarization insulating layer and to be in contact with respective ones of the gate electrodes of the stack, and a plurality of through vias, which are provided on the peripheral region to penetrate the planarization insulating layer, the mold structure, and the lower insulating layer and are electrically connected to the peripheral transistors of the peripheral circuit structure. The mold structure may have a concave top surface on the peripheral region, and the concave top surface of the mold structure may be located at a level lower than the topmost surface of the stack and a top surface of the planarization insulating layer.

According to an embodiment, an electronic system may include a three-dimensional semiconductor memory device including a first substrate, a peripheral circuit structure on the first substrate, a second substrate on the peripheral circuit structure, a lower insulating layer in contact with a side surface of the second substrate, a stack on the second substrate, and a mold structure on the lower insulating layer, an upper insulating layer on the stack and the mold structure, and an input/output pad on the upper insulating layer, and a controller connected to the three-dimensional semiconductor memory device through the input/output pad and configured to control the three-dimensional semiconductor memory device. A top surface of the lower insulating layer may have a concave profile, and a top surface of the mold structure may be located at a level lower than the topmost surface of the stack.

BRIEF DESCRIPTION OF THE DRAWINGS

Features will become apparent to those of skill in the art by describing in detail exemplary embodiments with reference to the attached drawings, in which.

DETAILED DESCRIPTION

Figure 1:
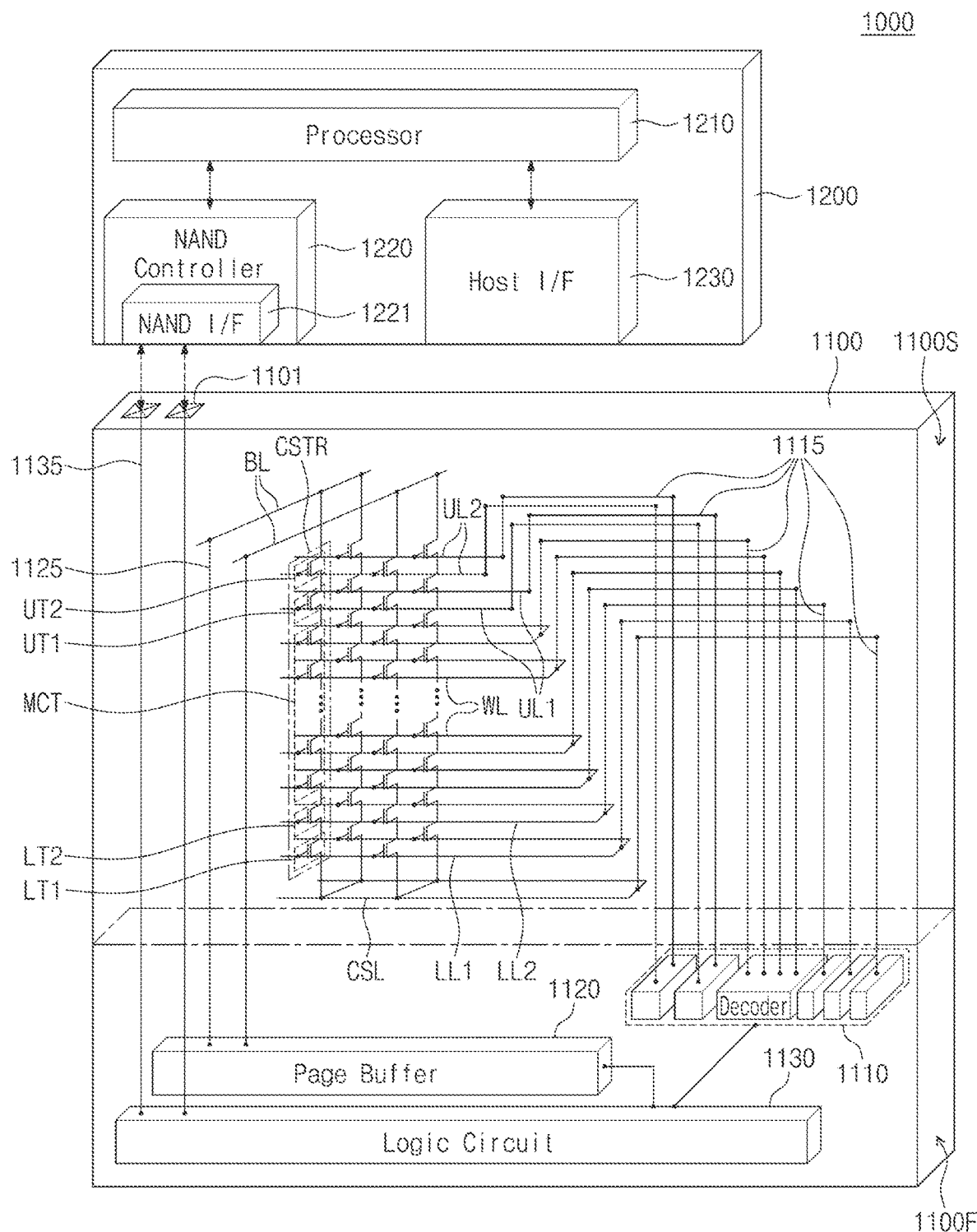
FIG. 1 is a schematic diagram of an electronic system including a three-dimensional semiconductor memory device, according to an embodiment.

FIG. 1 is a schematic diagram illustrating an electronic system including a three-dimensional semiconductor memory device according to an embodiment.

Referring to FIG. 1, an electronic system 1000 may include a three-dimensional semiconductor memory device 1100 and a controller 1200, which is electrically connected to the three-dimensional semiconductor memory device 1100. The electronic system 1000 may be a storage device including one or more three-dimensional semiconductor memory devices 1100 or an electronic device including the storage device. For example, the electronic system 1000 may be a solid state drive (SSD) device, a universal serial bus (USB), a computing system, a medical system, or a communication system, in which at least one three-dimensional semiconductor memory devices 1100 is provided.

The three-dimensional semiconductor memory device 1100 may be a nonvolatile memory device (e.g., a three-dimensional NAND FLASH memory device to be described below). The three-dimensional semiconductor memory device 1100 may include a first region 1100F and a second region 1100S on the first region 1100F. For example, the first region 1100F may be disposed beside the second region 1100S. The first region 1100F may be a peripheral circuit region, which includes a decoder circuit 1110, a page buffer 1120, and a logic circuit 1130. The second region 1100S may be a memory cell region, which includes a bit line BL, a common source line CSL, word lines WL, first lines LL1 and LL2, second lines UL1 and UL2, and memory cell strings CSTR between the bit line BL and the common source line CSL.

In the second region 1100S, each of the memory cell strings CSTR may include first transistors LT1 and LT2 adjacent to the common source line CSL, second transistors UT1 and UT2 adjacent to the bit line BL, and a plurality of memory cell transistors MCT disposed between the first transistors LT1 and LT2 and the second transistors UT1 and UT2. The number of the first transistors LT1 and LT2 and the number of the second transistors UT1 and UT2 may be variously changed, according to embodiments.

In an embodiment, the first transistors LT1 and LT2 may include a ground selection transistor, and the second transistors UT1 and UT2 may include a string selection transistor. The first lines LL1 and LL2 may serve as gate electrodes of the first transistors LT1 and LT2, respectively. The word lines WL may serve as gate electrodes of the memory cell transistors MCT. The second lines UL1 and UL2 may serve as gate electrodes of the second transistors UT1 and UT2, respectively.

In an embodiment, the first transistors LT1 and LT2 may include a first erase control transistor LT1 and a ground selection transistor LT2, which are connected in series. The second transistors UT1 and UT2 may include a string selection transistor UT1 and a second erase control transistor UT2, which are connected in series. At least one of the first and second erase control transistors LT1 and UT2 may be used for an erase operation of erasing data, which are stored in the memory cell transistors MCT, using a gate-induced drain leakage (GIDL) phenomenon.

The common source line CSL, the first lines LL1 and LL2, the word lines WL, and the second lines UL1 and UL2 may be electrically connected to the decoder circuit 1110 through first interconnection lines 1115, which are extended from the first region 1100F to the second region 1100S. The bit line BL may be electrically connected to the page buffer 1120 through second interconnection lines 1125, which are extended from the first region 1100F to the second region 1100S.

In the first region 1100F, the decoder circuit 1110 and the page buffer 1120 may be configured to control a control operation, which is performed on at least one of the memory cell transistors MCT. The decoder circuit 1110 and the page buffer 1120 may be controlled by the logic circuit 1130. The three-dimensional semiconductor memory device 1100 may communicate with the controller 1200 through an input/output pad 1101, which is electrically connected to the logic circuit 1130. The input/output pad 1101 may be electrically connected to the logic circuit 1130 through an input/output interconnection line 1135, which is extended from the first region 1100F to the second region 1100S.

The controller 1200 may include a processor 1210, a NAND controller 1220, and a host interface (I/F) 1230. For example, the electronic system 1000 may include a plurality of three-dimensional semiconductor memory devices 1100, and in this case, the controller 1200 may control the three-dimensional semiconductor memory devices 1100.

The processor 1210 may control overall operations of the electronic system 1000 including the controller 1200. Based on a specific firmware, the processor 1210 may execute operations of controlling the NAND controller 1220 and accessing the three-dimensional semiconductor memory device 1100. The NAND controller 1220 may include a NAND interface (I/F) 1221, which is used for communication with the three-dimensional semiconductor memory device 1100. The NAND interface 1221 may be used to transmit and receive control commands, which are used to control the three-dimensional semiconductor memory device 1100, data, which will be written in or read from the memory cell transistors MCT of the three-dimensional semiconductor memory device 1100, and so forth. The host interface 1230 may be configured to allow for communication between the electronic system 1000 and an external host. If a control command is received from an external host through the host interface 1230, the processor 1210 may control the three-dimensional semiconductor memory device 1100 in response to the control command.

Figure 2:
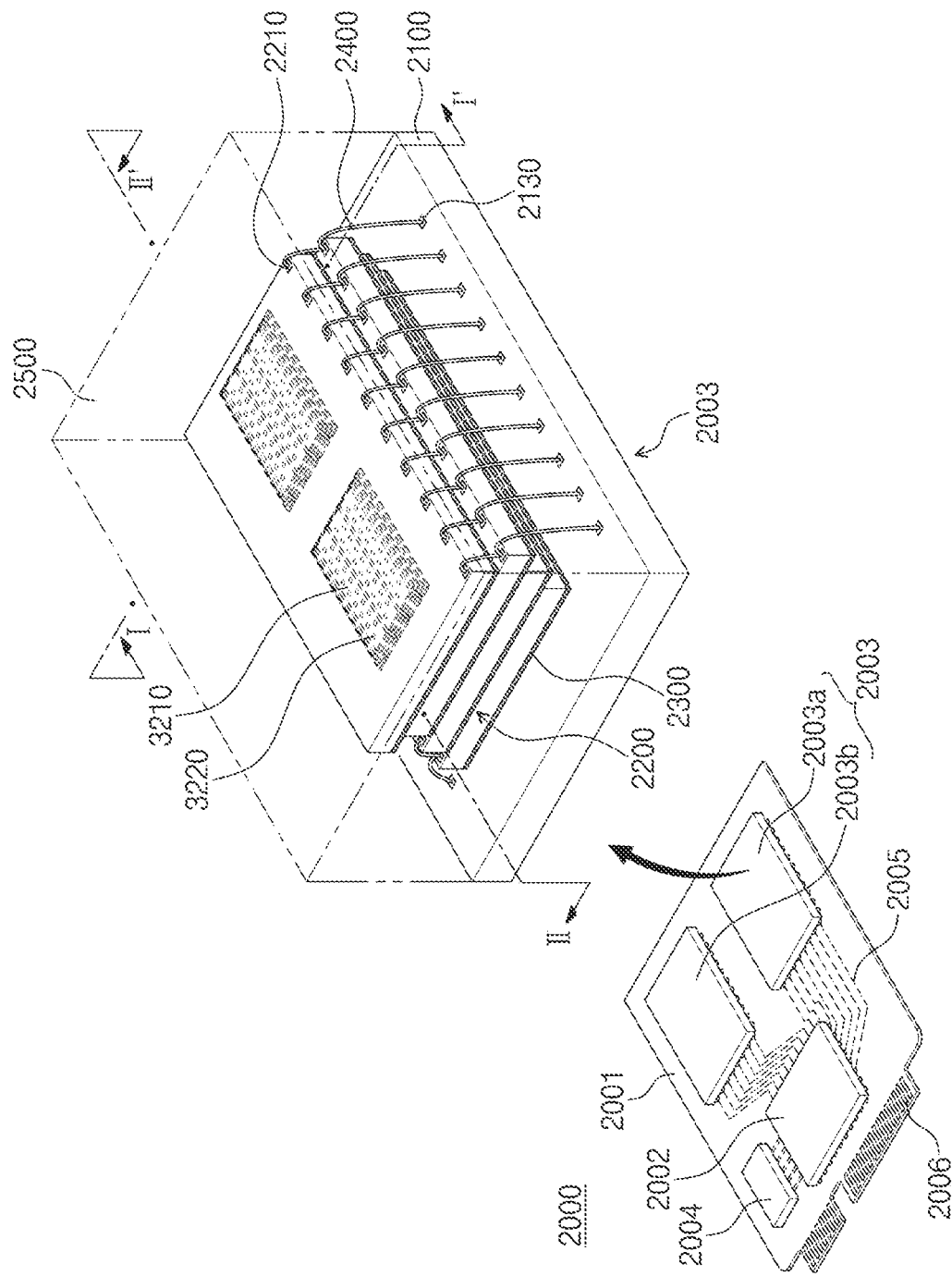
FIG. 2 is a perspective view of an electronic system including a three-dimensional semiconductor memory device, according to an embodiment.

FIG. 2 is a perspective schematically view of an electronic system including a three-dimensional semiconductor memory device, according to an embodiment.

Referring to FIG. 2, an electronic system 2000 may include a main substrate 2001 and a controller 2002, at least one semiconductor package 2003, and a dynamic random-access memory (DRAM) 2004, which are mounted on the main substrate 2001. The semiconductor package 2003 and the DRAM 2004 may be connected to the controller 2002 and to each other by interconnection patterns 2005, which are provided in the main substrate 2001.

The main substrate 2001 may include a connector 2006, which includes a plurality of pins coupled to an external host. In the connector 2006, the number and arrangement of the pins may depend on a communication interface between the electronic system 2000 and the external host. In an embodiment, the electronic system 2000 may communicate with the external host, in accordance with one of interfaces, e.g., universal serial bus (USB), peripheral component interconnect express (PCI-Express), serial advanced technology attachment (SATA), universal flash storage (UFS) M-PHY, or the like. In an embodiment, the electronic system 2000 may be driven by an electric power, which is supplied from the external host through the connector 2006. The electronic system 2000 may further include a power management integrated circuit (PMIC), which is used to distribute power supplied from the external host to the controller 2002 and the semiconductor package 2003. The controller 2002 may be configured to control a writing or reading operation on the semiconductor package 2003 and to improve an operation speed of the electronic system 2000.

The DRAM 2004 may be a buffer memory, which relieves technical difficulties caused by a difference in speed between the semiconductor package 2003, which serves as a data storage device, and an external host. In an embodiment, the DRAM 2004 in the electronic system 2000 may serve as a cache memory and may provide a storage space, in which data are temporarily stored during various control operations on the semiconductor package 2003. In the case where the electronic system 2000 includes the DRAM 2004, the controller 2002 may further include a DRAM controller for controlling the DRAM 2004, in addition to a NAND controller for controlling the semiconductor package 2003.

The semiconductor package 2003 may include first and second semiconductor packages 2003a and 2003b, which are spaced apart from each other. Each of the first and second semiconductor packages 2003a and 2003b may be a semiconductor package including a plurality of semiconductor chips 2200. Each of the first and second semiconductor packages 2003a and 2003b may include a package substrate 2100, the semiconductor chips 2200 on the package substrate 2100, adhesive layers 2300 respectively disposed on bottom surfaces of the semiconductor chips 2200, a connection structure 2400 electrically connecting the semiconductor chips 2200 to the package substrate 2100, and a molding layer 2500 disposed on the package substrate 2100 to cover the semiconductor chips 2200 and the connection structure 2400.

The package substrate 2100 may be a printed circuit board including package upper pads 2130. Each of the semiconductor chips 2200 may include input/output pads 2210. Each of the input/output pads 2210 may correspond to the input/output pad 1101 of FIG. 1. Each of the semiconductor chips 2200 may include gate stacks 3210 and vertical channel structures 3220. Each of the semiconductor chips 2200 may include a three-dimensional semiconductor memory device, which will be described below.

In an embodiment, the connection structure 2400 may be a bonding wire electrically connecting the input/output pads 2210 to the package upper pads 2130. In each of the first and second semiconductor packages 2003a and 2003b, the semiconductor chips 2200 may be electrically connected to each other in a bonding wire manner and may be electrically connected to the package upper pads 2130 of the package substrate 2100. In an embodiment, the semiconductor chips 2200 in each of the first and second semiconductor packages 2003a and 2003b may be electrically connected to each other by through silicon vias (TSVs), not by the connection structure 2400 provided in the form of bonding wires.

In an embodiment, the controller 2002 and the semiconductor chips 2200 may be included in a single package. For example, the controller 2002 and the semiconductor chips 2200 may be mounted on a separate interposer substrate, which is independent of the main substrate 2001, and may be connected to each other through interconnection lines, which are provided in the interposer substrate.

Figure 3:
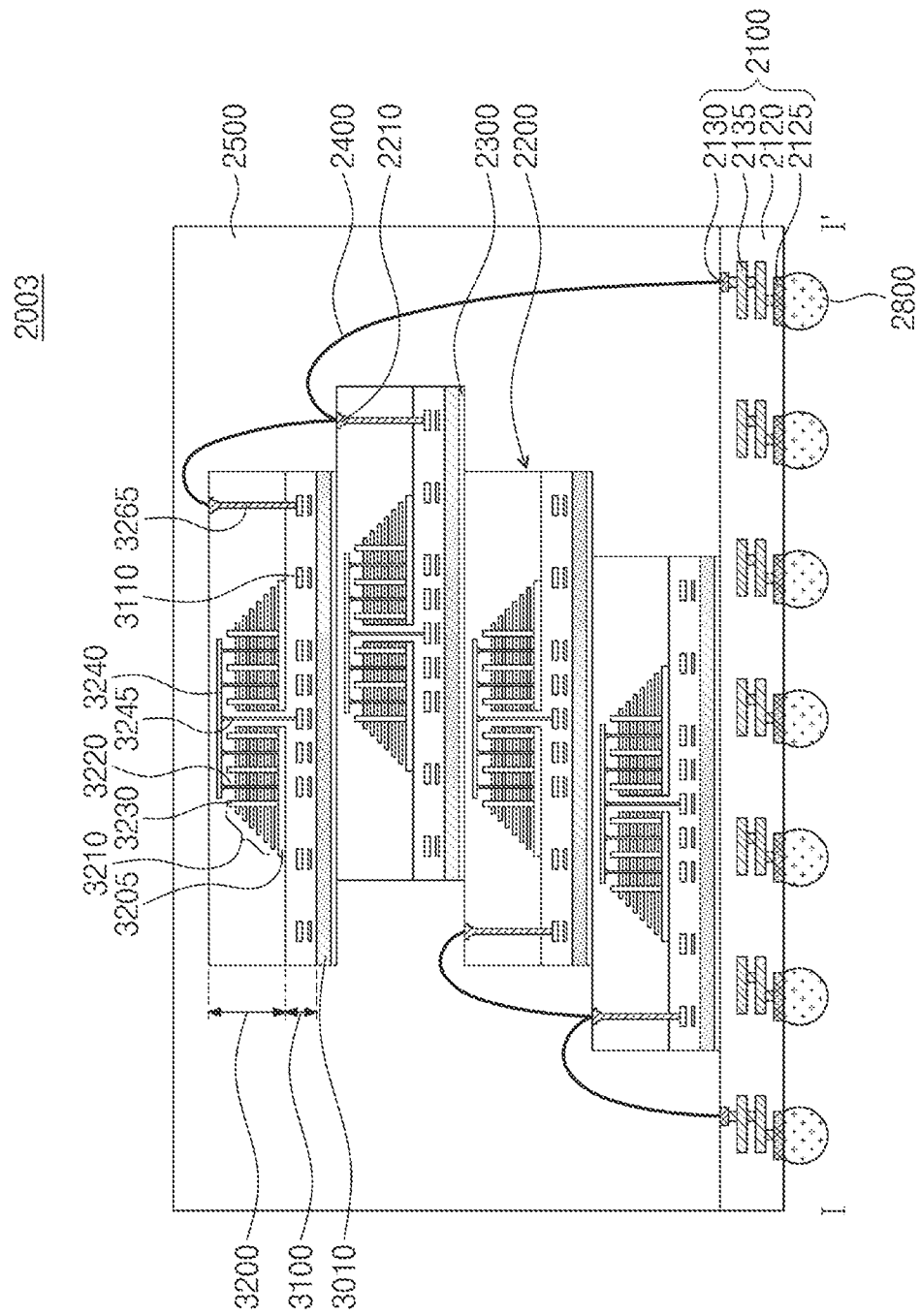
FIGS. 3 and 4 are schematic cross-sectional views along lines I-I' and II-II', respectively, of FIG. 2.
Figure 4:
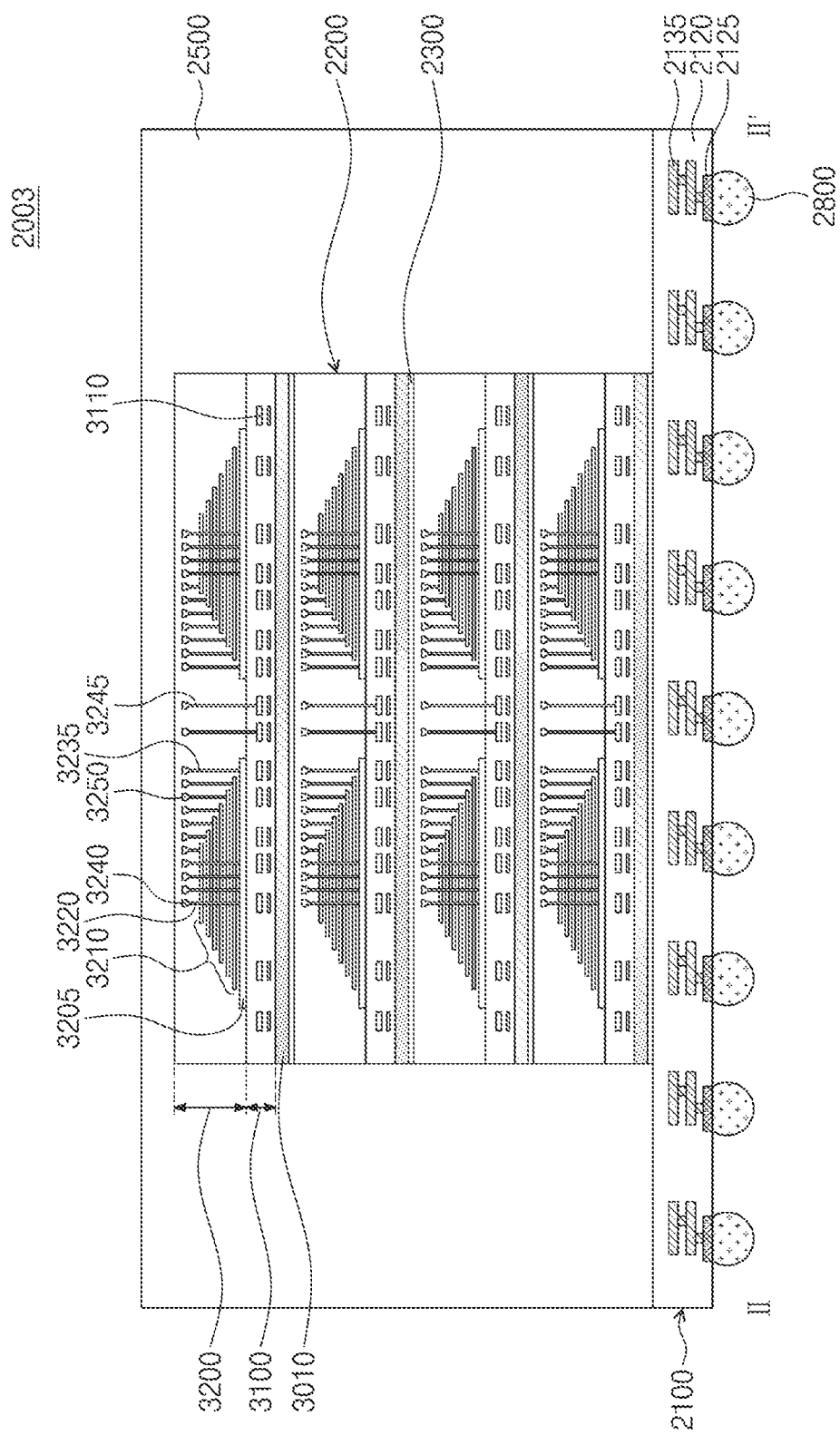

FIGS. 3 and 4 are sectional views, which are presented to illustrate a semiconductor package including a three-dimensional semiconductor memory device according to an embodiment. FIGS. 3 and 4 are view along lines I-I' and respectively, of FIG. 2.

Referring to FIGS. 2-4, the semiconductor package 2003 may include the package substrate 2100, the plurality of semiconductor chips 2200 on the package substrate 2100, and the molding layer 2500 covering the package substrate 2100 and the semiconductor chips 2200.

The package substrate 2100 may include a package substrate body portion 2120, upper pads 2130 disposed on a top surface of the package substrate body portion 2120, lower pads 2125 disposed on or exposed through a bottom surface of the package substrate body portion 2120, and internal lines 2135 provided in the package substrate body portion 2120 to electrically connect the upper pads 2130 to the lower pads 2125. The upper pads 2130 may be electrically connected to the connection structures 2400. The lower pads 2125 may be connected to the interconnection patterns 2005 of the main substrate 2001 of the electronic system 2000 of FIG. 2 through conductive connecting portions 2800.

Each of the semiconductor chips 2200 may include a semiconductor substrate 3010 and a first structure 3100 and a second structure 3200, which are sequentially stacked on the semiconductor substrate 3010. The first structure 3100 may include a peripheral circuit region, in which peripheral interconnection lines 3110 are provided. The second structure 3200 may include a common source line 3205, the gate stack 3210 on the common source line 3205, vertical channel structures 3220 and separation structures 3230 penetrating the gate stack 3210, bit lines 3240 electrically connected to the vertical channel structures 3220, gate connection lines 3235 electrically connected to the word lines WL (e.g., see FIG. 1) of the gate stack 3210, and conductive lines 3250.

Each of the semiconductor chips 2200 may include a penetration line 3245, which is electrically connected to the peripheral interconnection line 3110 of the first structure 3100 and is extended into the second structure 3200. The penetration line 3245 may penetrate the gate stack 3210 and, in an embodiment, at least one penetration line 3245 may be further provided outside the gate stack 3210. Each of the semiconductor chips 2200 may further include an input/output interconnection line 3265, which is electrically connected to the peripheral interconnection line 3110 of the first structure 3100 and is extended into the second structure 3200, and an input/output pad 2210, which is electrically connected to the input/output interconnection line 3265.

Figure 5:
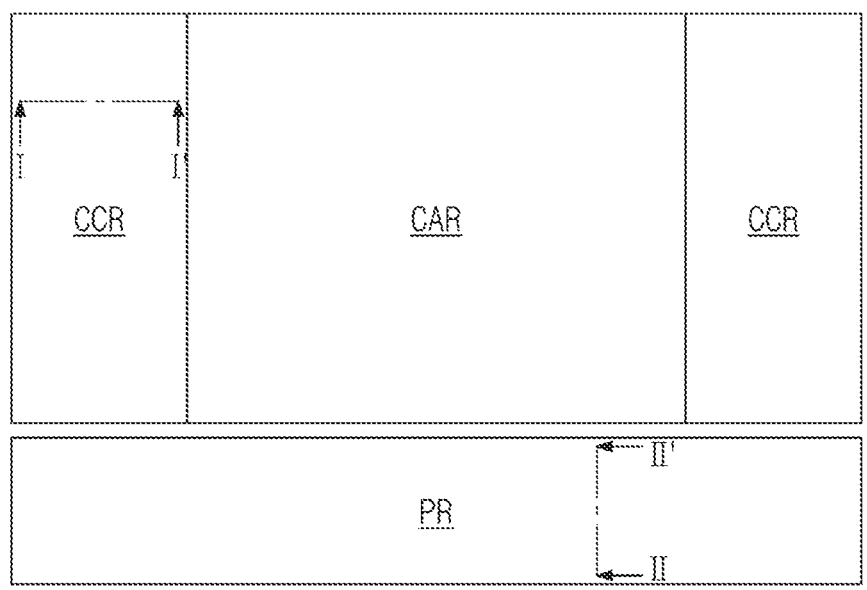
FIG. 5 is a plan view of a three-dimensional semiconductor memory device according to an embodiment.
Figure 5:
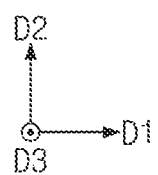

FIG. 5 is a plan view schematically illustrating a three-dimensional semiconductor memory device according to an embodiment.

Referring to FIG. 5, a three-dimensional semiconductor memory device may include a cell array region CAR, a contact region CCR, which is extended from the cell array region CAR in a first direction D1 or an opposite direction of the first direction D1, and a peripheral region PR, which is adjacent to the cell array region CAR in a second direction D2, when viewed in a plan view.

The gate stacks 3210, the separation structures 3230, the vertical channel structures 3220, and the bit lines 3240 described with reference to FIGS. 3 and 4 may be provided in the cell array region CAR. The contact region CCR may have a staircase structure that is formed by pad portions ELp to be described below. The contact region CCR may be extended from the cell array region CAR in the second direction D2 or in an opposite direction of the second direction D2. A mold structure MS, which will be described below, may be provided in the peripheral region PR. The peripheral region PR may be spaced apart from the cell array region CAR in the second direction D2.

Figure 6:
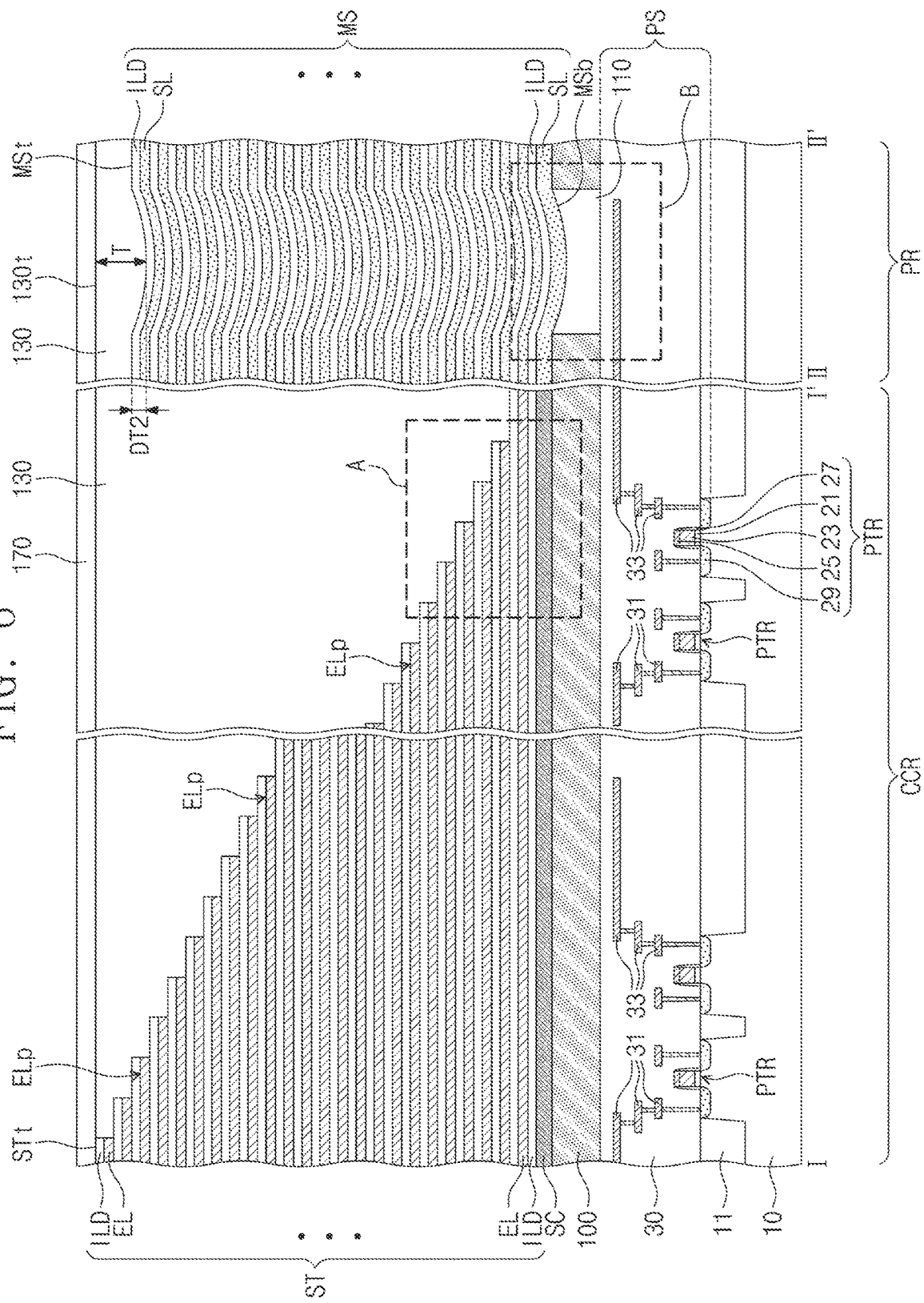
FIG. 6 is a cross-sectional view along lines I-I' and II-II' of FIG. 5.

FIG. 6 is a detailed cross-sectional view along lines I-I' and II-II' of FIG. 5.

Referring to FIGS. 5 and 6, a first substrate 10 including the cell array region CAR, the contact region CCR, and the peripheral region PR may be provided. The first substrate 10 may be extended from the cell array region CAR toward the contact region CCR in the first direction D1. In addition, the first substrate 10 may be extended from the cell array region CAR toward the peripheral region PR in the second direction D2.

In an embodiment, the first substrate 10 may be, e.g., a silicon substrate, a silicon-germanium substrate, a germanium substrate, or a structure including a single-crystalline silicon substrate and a single crystalline epitaxial layer grown therefrom. A device isolation layer 11 may be provided in the first substrate 10. The device isolation layer 11 may define an active region of the first substrate 10. The device isolation layer 11 may be formed of or include, e.g., silicon oxide.

A peripheral circuit structure PS may be provided on the first substrate 10. The peripheral circuit structure PS may correspond to the first region 1100F of FIG. 1. The peripheral circuit structure PS may include peripheral transistors PTR on the active region of the first substrate 10, peripheral contact plugs 31, peripheral circuit lines 33 electrically connected to the peripheral transistors PTR via the peripheral contact plugs 31, and a peripheral circuit insulating layer 30 enclosing them.

The peripheral transistors PTR, the peripheral contact plugs 31, and the peripheral circuit lines 33 may constitute a peripheral circuit. For example, the peripheral transistors PTR may constitute the decoder circuit 1110, the page buffer 1120, and the logic circuit 1130 of FIG. 1. In an embodiment, each of the peripheral transistors PTR may include a peripheral gate insulating layer 21, a peripheral gate electrode 23, a peripheral capping pattern 25, a peripheral gate spacer 27, and peripheral source/drain regions 29.

The peripheral gate insulating layer 21 may be provided between the peripheral gate electrode 23 and the first substrate 10. The peripheral capping pattern 25 may be provided on the peripheral gate electrode 23. The peripheral gate spacer 27 may cover side surfaces of the peripheral gate insulating layer 21, the peripheral gate electrode 23, and the peripheral capping pattern 25. The peripheral source/drain regions 29 may be provided in portions of the first substrate 10, which are located at both sides of the peripheral gate electrode 23.

The peripheral circuit lines 33 may be electrically connected to the peripheral transistors PTR through the peripheral contact plugs 31. Each of the peripheral transistors PTR may be an NMOS transistor or a PMOS transistor and, in an embodiment, it may be a gate-all-around type transistor. As an example, widths of the peripheral contact plugs 31 may increase with increasing distance from the first substrate 10. The peripheral contact plugs 31 and the peripheral circuit lines 33 may be formed of or include at least one of conductive materials (e.g., metallic materials).

The peripheral circuit insulating layer 30 may be provided on the top surface of the first substrate 10. For example, the peripheral circuit insulating layer 30 may be provided on the first substrate 10 to cover the peripheral transistors PTR, the peripheral contact plugs 31, and the peripheral circuit lines 33. The peripheral circuit insulating layer 30 may be provided to include a plurality of insulating layers or to have a multi-layered structure. For example, the peripheral circuit insulating layer 30 may be formed of or include at least one of silicon oxide, silicon nitride, silicon oxynitride, and/or low-k dielectric materials.

A second substrate 100 may be provided on the peripheral circuit insulating layer 30. The second substrate 100 may be extended from the cell array region CAR toward the contact region CCR in the first direction D1. In addition, the second substrate 100 may be extended from the cell array region CAR toward the peripheral region PR in the second direction D2 and may be provided on a portion of the peripheral region PR. The second substrate 100 may be a semiconductor substrate including a semiconductor material. The second substrate 100 may be formed of or include at least one of, e.g., silicon (Si), germanium (Ge), silicon germanium (SiGe), gallium arsenic (GaAs), indium gallium arsenic (InGaAs), or aluminum gallium arsenic (AlGaAs).

A stack ST and the mold structure MS may be provided on the second substrate 100. The stack ST may be provided on the cell array region CAR and the contact region CCR, and the mold structure MS may be provided on the peripheral region PR.

The stack ST may correspond to the gate stacks 3210 of FIGS. 3 and 4. For example, the three-dimensional semiconductor memory device may include a plurality of stacks ST, which are spaced apart from each other. For brevity's sake, just one stack ST will be described below, but other stacks ST may also have substantially the same features as described below.

The stack ST may include interlayer dielectric layers ILD and gate electrodes EL, which are alternately and repeatedly stacked on the second substrate 100. The gate electrodes EL may correspond to the word lines WL, the first lines LL1 and LL2, and the second lines UL1 and UL2 of FIG. 1.

The gate electrodes EL may have substantially the same thickness. Lengths of the gate electrodes EL in a horizontal direction may decrease with increasing distance from the second substrate 100. Hereinafter, the horizontal direction may mean a direction that is parallel to a top surface of the second substrate 100. In other words, a length of each of the gate electrodes EL in the horizontal direction may be larger than a length of a gate electrode thereon in the horizontal direction. When measured in the horizontal direction, the lowermost one of the gate electrodes EL may have the longest length, and the uppermost one of the gate electrodes EL may have the shortest length.

The gate electrodes EL may include the pad portions ELp, which are provided on the contact region CCR. Each of the pad portions ELp may be a portion of the gate electrode EL that is not veiled, e.g., covered, by another gate electrode thereon, when viewed in a plan view. The pad portions ELp of the gate electrodes EL may be disposed at positions that are different from each other in horizontal and vertical directions. The pad portions ELp may form a staircase structure in the horizontal direction. Due to the aforedescribed staircase structure, the stack ST may have a thickness, e.g., in a direction normal to the bottom of the second substrate 100, that decreases with increasing distance from the cell array region CAR, and side surfaces of the gate electrodes EL may be spaced apart from each other by a specific distance in the horizontal direction, e.g., along the first direction D1, when viewed in a plan view.

The gate electrodes EL may be formed of or include at least one of, e.g., doped semiconductors (e.g., doped silicon and so forth), metals (e.g., tungsten, copper, aluminum, and so forth), conductive metal nitrides (e.g., titanium nitride, tantalum nitride, and so forth), or transition metals (e.g., titanium, tantalum, and so forth). The interlayer dielectric layers ILD may be provided between the gate electrodes EL, and a side surface of each of the interlayer dielectric layers ILD may be aligned to a side surface of a corresponding one of the gate electrodes EL, which is disposed under the same and is in contact with the same. That is, similar to the gate electrodes EL, lengths of the interlayer dielectric layers ILD in the horizontal direction may decrease with increasing distance from the second substrate 100.

The lowermost one of the interlayer dielectric layers ILD may be in contact with a source structure SC, which will be described below, and the uppermost one of the interlayer dielectric layers ILD may be in contact with an upper insulating layer 170, which will be described below. In an embodiment, each of the interlayer dielectric layers ILD may have a thickness that is smaller than or equal to a thickness of each of the gate electrodes EL. As an example, the lowermost one of the interlayer dielectric layers ILD may be thinner than the others of the interlayer dielectric layers ILD. Also, the uppermost one of the interlayer dielectric layers ILD may be thicker than the others of the interlayer dielectric layers ILD. Except for the uppermost and lowermost ones of the interlayer dielectric layers ILD, the remaining ones of the interlayer dielectric layers ILD may have substantially the same thickness. However, embodiments are not limited to this example, and the thicknesses of the gate electrodes EL and the interlayer dielectric layers ILD may be variously changed depending on requirements for the semiconductor device.

The interlayer dielectric layers ILD may be formed of or include at least one of, e.g., silicon oxide, silicon nitride, silicon oxynitride, and/or low-k dielectric materials. For example, the interlayer dielectric layers ILD may be formed of or include high density plasma (HDP) oxide or tetraethylorthosilicate (TEOS).

The source structure SC may be provided between the second substrate 100 and the lowermost one of the interlayer dielectric layers ILD. The source structure SC may serve as the common source line CSL of FIG. 1 and the common source line 3205 of FIGS. 3 and 4. The source structure SC may be extended from the cell array region CAR toward the contact region CCR to be parallel to the second substrate 100. The source structure SC may include a plurality of conductive patterns, which are sequentially stacked. The source structure SC may be formed of or include at least one of doped semiconductor materials. In an embodiment, the conductive patterns of the source structure SC may have different impurity concentrations from each other.

A lower insulating layer 110 and a portion of the second substrate 100 may be provided on the peripheral circuit insulating layer 30 of the peripheral region PR. The lower insulating layer 110 may be provided between the peripheral circuit insulating layer 30 and the mold structure MS. A bottom surface of the lower insulating layer 110 may be in contact with a top surface of the peripheral circuit insulating layer 30, and a top surface of the lower insulating layer 110 may be in contact with a bottom surface MSb of the mold structure MS. The top surface of the lower insulating layer 110 may have a concave profile, e.g., the top surface of the lower insulating layer 110 may curve downwardly toward the peripheral circuit insulating layer 30 of the peripheral region PR. The concave profile of the top surface of the lower insulating layer 110 may result from a dishing phenomenon to be described with reference to FIGS. 9 to 12. A thickness of the lower insulating layer 110, e.g., in a vertical direction extending along a normal direction to the bottom of the second substrate 100, may decrease with increasing distance from a side surface of the second substrate 100. A side surface of the lower insulating layer 110 may be in contact with the side surface of the second substrate 100. The lower insulating layer 110 may be formed of or include, e.g., silicon oxide.

The mold structure MS may be provided on the lower insulating layer 110 and the second substrate 100. The mold structure MS may include the interlayer dielectric layers ILD and sacrificial layers SL, which are alternately and repeatedly stacked on the lower insulating layer 110 and the second substrate 100.

The interlayer dielectric layers ILD of the mold structure MS may be located at substantially the same levels as the interlayer dielectric layers ILD of the stack ST, may have the same thickness as those of the stack ST, and may be formed of or include the same material as those of the stack ST. The sacrificial layers SL of the mold structure MS may be located at substantially the same levels as the source structure SC and the gate electrodes EL of the stack ST, may have the same thickness as those of the stack ST, but may be formed of or include a material different from those of the stack ST. The lowermost one of the sacrificial layers SL may be located at substantially the same level as the source structure SC, and the remaining ones of the sacrificial layers SL, except the lowermost one, may be located at substantially the same level as the gate electrodes EL. The sacrificial layers SL may be formed of or include a material having an etch selectivity with respect to the interlayer dielectric layers ILD. For example, the sacrificial layers SL may be formed of or include silicon nitride.

The interlayer dielectric layers ILD of the mold structure MS may be spaced apart from the interlayer dielectric layers ILD of the stack ST in the horizontal direction, and the sacrificial layers SL of the mold structure MS may be spaced apart from the source structure SC and the gate electrodes EL of the stack ST in the horizontal direction.

Each of the interlayer dielectric layers ILD and the sacrificial layers SL of the mold structure MS may have at least a portion that is bent toward the lower insulating layer 110, e.g., in a region vertically overlapping the lower insulating layer 110. Accordingly, at least a portion of the mold structure MS may be overlapped with the second substrate 100 in the horizontal direction, e.g., a portion of the bottommost sacrificial layer SL that extends directly along the concave upper surface of the lower insulating layer 110 may overlap an upper portion of the second substrate 100 in the horizontal direction. Further, at least a portion of a top surface MSt of the mold structure MS may have a concave profile. In addition, at least a portion of the bottom surface MSb of the mold structure MS may have a convex profile toward the first substrate 10 and may be located at a level that is lower than the bottom surface of the source structure SC and the top surface of the second substrate 100.

A planarization insulating layer 130 may be provided in the contact region CCR and the peripheral region PR to cover the stack ST and the mold structure MS. More specifically, the planarization insulating layer 130 may be provided on the pad portions ELp of the gate electrodes EL of the stack ST to cover the staircase structure of the stack ST. In addition, the planarization insulating layer 130 may be provided on the uppermost one of the interlayer dielectric layers ILD of the mold structure MS to cover the top surface MSt of the mold structure MS.

A top surface 130t of the planarization insulating layer 130 may be substantially coplanar with the topmost surface STt of the stack ST. More specifically, the top surface 130t of the planarization insulating layer 130 may be substantially coplanar with the top surface of the uppermost one of the interlayer dielectric layers ILD of the stack ST. The top surface 130t of the planarization insulating layer 130 may be located at a level that is higher than the top surface MSt of the mold structure MS. More specifically, the top surface 130t of the planarization insulating layer 130 may be located at a level higher than the top surface of the uppermost one of the interlayer dielectric layers ILD of the mold structure MS.

The planarization insulating layer 130 may have a substantially flat top surface, e.g., in parallel to the bottom of the first substrate 10. For example, the concave profile of the top surface of the lower insulating layer 110, which is caused by the dishing phenomenon, may not be transcribed to the top surface 130t of the planarization insulating layer 130, e.g., the planarization insulating layer 130 may be planarized to remove any curved or non-flat portions in order to form the flat top surface 130t. Accordingly, in a process of filling the vertical channel holes CH (e.g., see FIG. 7) of the contact region CCR with a semiconductor material and planarizing the semiconductor material, it may be possible to prevent the semiconductor material from being left on the mold structure MS of the peripheral region PR, as will be described below. Thus, when, as will be described with reference to FIG. 8, through vias THV are formed to penetrate the mold structure MS of the peripheral region PR, it may be possible to prevent or suppress the through vias THV from being undesirably connected to each other by a remnant, e.g., residue, semiconductor material, e.g., since any non-flat portions may be removed from the planarization insulating layer 130 before forming or filling the vertical channel holes CH, and it may be possible to improve the electrical characteristics and reliability of the three-dimensional semiconductor memory device.

The planarization insulating layer 130 may include an insulating layer or a plurality of stacked insulating layers. The planarization insulating layer 130 may be formed of or include at least one of, e.g., silicon oxide, silicon nitride, silicon oxynitride, and/or low-k dielectric materials. The planarization insulating layer 130 may be formed of or include an insulating material that is different from the interlayer dielectric layers ILD of the stack ST and the interlayer dielectric layers ILD of the mold structure MS. As an example, in the case where the interlayer dielectric layers ILD are formed of or include the HDP oxide, the planarization insulating layer 130 may be formed of or include TEOS.

The upper insulating layer 170 may be provided on the planarization insulating layer 130 and the stack ST. The upper insulating layer 170 may cover a top surface of the planarization insulating layer 130 and a top surface of the uppermost one of the interlayer dielectric layers ILD of the stack ST. The upper insulating layer 170 may include an insulating layer or a plurality of stacked insulating layers. The upper insulating layer 170 may be formed of or include at least one of, e.g., silicon oxide, silicon nitride, silicon oxynitride, and/or low-k dielectric materials. In an embodiment, the upper insulating layer 170 may be formed of or include an insulating material that is of substantially the same kind as the planarization insulating layer 130 and is different from the interlayer dielectric layers ILD of the stack ST and the interlayer dielectric layers ILD of the mold structure MS.

Bit line contact plugs may be provided to penetrate the upper insulating layer 170 and may be connected to vertical channel structures VS to be described below, and bit lines (e.g., see BL of FIG. 1 or 3240 of FIGS. 3 and 4) may be provided on the upper insulating layer 170 and may be connected to the bit line contact plugs, respectively. In an embodiment, additional interconnection lines and additional vias may be further provided on the upper insulating layer 170.

Figure 7:
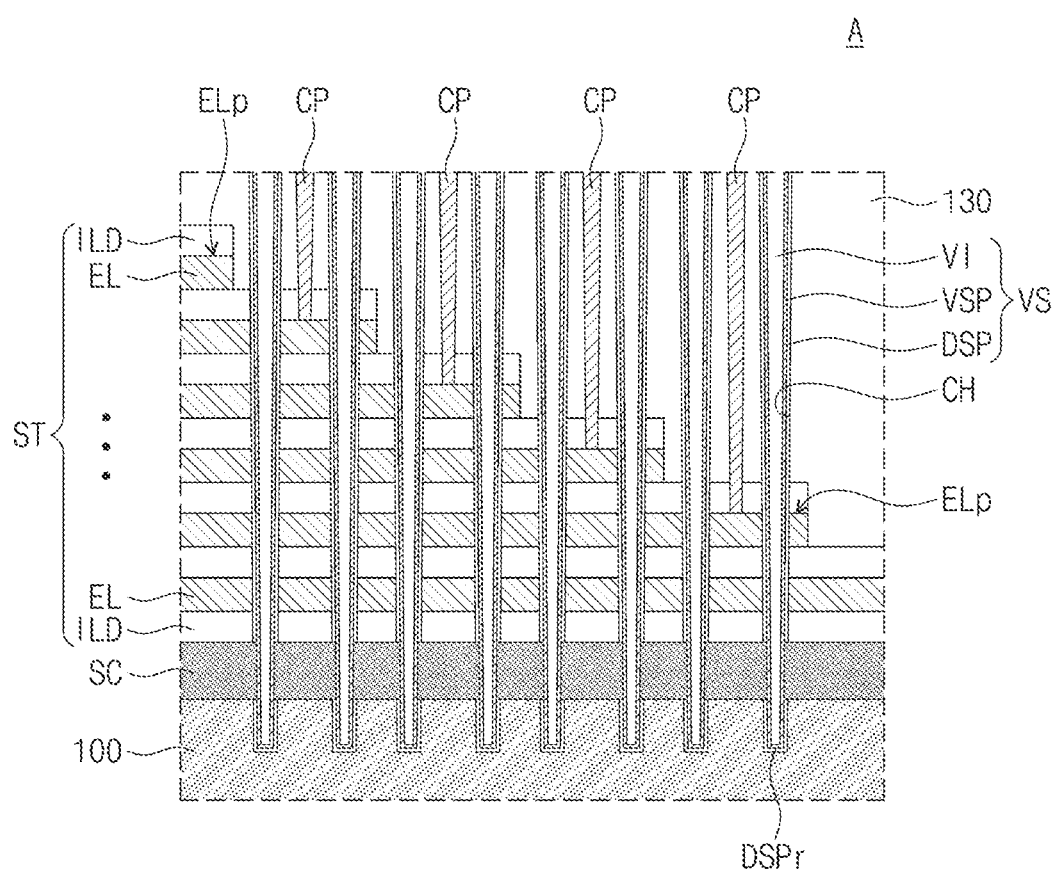
FIGS. 7 and 8 are enlarged views of portions "A" and "B" in FIG. 6, respectively.

FIG. 7 is an enlarged view of portion "A" FIG. 6.

Referring to FIGS. 6 and 7, a plurality of vertical channel structures VS may be provided in the contact region CCR to penetrate the planarization insulating layer 130, the stack ST, and the source structure SC. The vertical channel structures VS may be provided to penetrate at least a portion of the second substrate 100, and a bottom surface of each of the vertical channel structures VS may be located at a level that is lower than the bottom surface of the source structure SC. The vertical channel structures VS may also be provided in the cell array region CAR of FIG. 5. However, the vertical channel structures VS may not be provided in the peripheral region PR. The vertical channel structures VS may correspond to the vertical channel structures 3220 of FIGS. 2 to 4. The vertical channel structures VS may serve as the channel regions of the first transistors LT1 and LT2, the memory cell transistors MCT, and the second transistors UT1 and UT2 of FIG. 1.

The vertical channel structures VS may be provided in the vertical channel holes CH, which are formed to penetrate the stack ST. In an embodiment, widths of the vertical channel holes CH and the vertical channel structures VS in the horizontal direction may increase with increasing distance from the second substrate 100.

Each of the vertical channel structures VS may include a data storage pattern DSP, which is formed to conformally cover a side surface of each of the vertical channel holes CH, a vertical semiconductor pattern VSP, which is formed to conformally cover a side surface of the data storage pattern DSP, and a gapfill insulating pattern VI, which is formed to fill an internal space of each of the vertical channel holes CH enclosed by the vertical semiconductor pattern VSP. Each of the vertical channel structures VS may have a circular, elliptical, or bar-shaped top surface. Each of the vertical channel structures VS may further include the lower data storage pattern DSPr, which is provided at a level lower than the bottom surface of the source structure SC to enclose the bottom and side surfaces of the vertical semiconductor pattern VSP. A portion of the source structure SC may protrude into the vertical channel holes CH and may be in contact with the vertical semiconductor pattern VSP of each of the vertical channel structures VS, but embodiments are not limited to this example.

Each of the vertical channel structures VS may further include a conductive pad, which is provided on the gapfill insulating pattern VI and is formed of or include a doped semiconductor material or a conductive material. A top surface of the conductive pad may be substantially coplanar with the top surface 130t of the planarization insulating layer 130 and may be referred to as a top surface of each of the vertical channel structures VS.

The vertical semiconductor pattern VSP may be provided between the data storage pattern DSP and the gapfill insulating pattern VI. The vertical semiconductor pattern VSP may be shaped like a bottom-closed pipe or macaroni. The data storage pattern DSP may be shaped like a bottom-opened pipe or macaroni. The vertical semiconductor pattern VSP may be formed of or include at least one of doped semiconductor materials or undoped or intrinsic semiconductor materials and may have a poly-crystalline or single-crystalline structure.

The data storage pattern DSP may include a plurality of layers, which are sequentially stacked on a side surface of each of the vertical channel holes CH. More specifically, the data storage pattern DSP may include a blocking insulating layer, a charge storing layer, and a tunneling insulating layer, which are sequentially stacked on the side surface of the vertical channel hole CH. The blocking insulating layer may be adjacent to the stack ST or the source structure SC, and the tunneling insulating layer may be adjacent to the vertical semiconductor pattern VSP. The charge storing layer may be interposed between the blocking insulating layer and the tunneling insulating layer. The blocking insulating layer, the charge storing layer, and the tunneling insulating layer may be extended from a region between the stack ST and the vertical semiconductor pattern VSP in the vertical direction. In an embodiment, the Fowler-Nordheim (FN) tunneling phenomenon, which is caused by a voltage difference between the vertical semiconductor pattern VSP and the gate electrodes EL, may be used to store or change data in the data storage pattern DSP. For example, the blocking insulating layer and the tunneling insulating layer may be formed of or include, e.g., silicon oxide, and the charge storing layer may be formed of or include, e.g., silicon nitride or silicon oxynitride.

A plurality of cell contact plugs CP may be provided in the contact region CCR to penetrate the planarization insulating layer 130 and at least a portion of the stack ST. However, the cell contact plugs CP may not be provided on the cell array region CAR and the peripheral region PR of FIG. 5. Each of the cell contact plugs CP may be provided to penetrate the planarization insulating layer 130 and one of the interlayer dielectric layers ILD adjacent thereto and may be in direct contact with a corresponding one of the pad portions ELp of the gate electrodes EL. The cell contact plugs CP may correspond to the gate connection lines 3235 of FIG. 4. Widths of the cell contact plugs CP in the horizontal direction may increase with increasing distance from the second substrate 100. The cell contact plugs CP may be formed of or include at least one of conductive materials (e.g., metallic materials).

Figure 8:
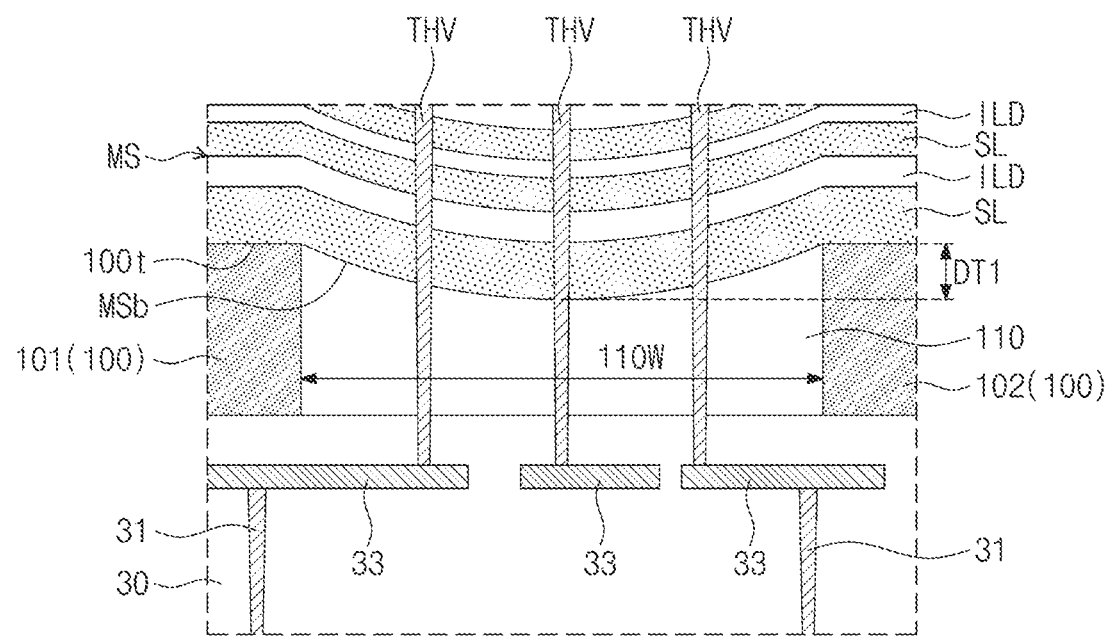

FIG. 8 is an enlarged view of portion "B" of FIG. 6.

Referring to FIGS. 6 and 8, the through vias THV may be provided in the peripheral region PR to penetrate the planarization insulating layer 130, the mold structure MS, and the lower insulating layer 110. The through vias THV may be spaced apart from the side surface of the second substrate 100 in the horizontal direction.

The through vias THV may further penetrate at least a portion of the peripheral circuit insulating layer 30. The through vias THV may be electrically connected to the peripheral transistors PTR through the peripheral contact plugs 31 and the peripheral circuit lines 33 of the peripheral circuit structure PS. In an embodiment, widths of the through vias THV in the horizontal direction may increase with increasing distance from the second substrate 100. The through vias THV may be formed of or include at least one of conductive materials (e.g., metallic materials).

The second substrate 100 of the peripheral region PR may include a first portion 101 and a second portion 102. The first portion 101 and the second portion 102 may be spaced apart from each other in the horizontal direction. The lower insulating layer 110 may be provided between the first portion 101 and the second portion 102, e.g., the lower insulating layer 110 may be provided between facing side surfaces of the first portion 101 and the second portion 102. A length 110W of the lower insulating layer 110 in the horizontal direction may be defined as a distance between a side surface of the first portion 101 and a side surface of the second portion 102, e.g., as a distance between the facing side surfaces of the first portion 101 and the second portion 102. For example, the length 110W of the lower insulating layer 110 in the horizontal direction may range from about 50 μm to 500 μm.

A difference in level between a top surface 100t of the second substrate 100 and the lowest point of the bottom surface MSb of the mold structure MS may be defined as a first distance DT1, as illustrated in FIG. 8. In an embodiment, the first distance DT1 may range from about 10 nm to 100 nm. That is, a thickness of the mold structure MS, which is overlapped with the second substrate 100 in the horizontal direction, may range from about 10 nm to 100 nm.

A difference in level between the highest and lowest points of the top surface MSt of the mold structure MS may be defined as a second distance DT2, as illustrated in FIG. 6. For example, the second distance DT2 may range from about 10 nm to 100 nm. In other words, a thickness of the planarization insulating layer 130, which is overlapped with the mold structure MS in the horizontal direction on the peripheral region PR, may range from about 10 nm to 100 nm.

The largest thickness T of the planarization insulating layer 130, which is provided on the peripheral region PR, may be larger than the second distance DT2. For example, the largest thickness T of the planarization insulating layer 130 provided on the peripheral region PR may be larger than about 100 nm. The upper limit of the largest thickness T of the planarization insulating layer 130 provided on the peripheral region PR may vary depending on a result of an etching process on the mold structure MS which will be described with reference to FIG. 14.

FIGS. 9 to 14 are cross-sectional views of stages in a method of fabricating the three-dimensional semiconductor memory device of FIG. 6. The cross-sections in FIGS. 9 to 14 correspond to vertical sections taken along lines I-I' and II-II' of FIG. 5. Hereinafter, the fabrication method will be described in more detail with reference to FIGS. 6 and 9 to 14.

Figure 9:
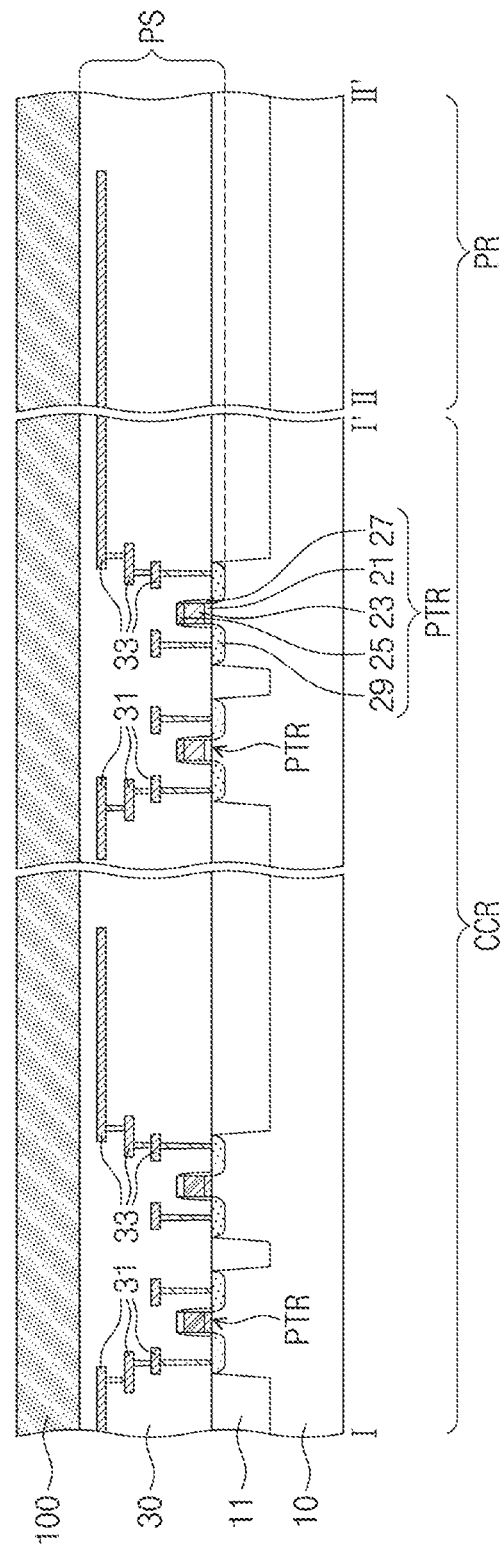
FIGS. 9 to 14 are cross-sectional views of stages in a method of fabricating the three-dimensional semiconductor memory device of FIG. 6.

Referring to FIG. 9, the first substrate 10, which is extended from the cell array region CAR (e.g., see FIG. 5) toward the contact region CCR, may be provided. In addition, the first substrate 10 may be extended from the cell array region CAR (e.g., see FIG. 5) toward the peripheral region PR.

The device isolation layer 11 may be formed to define an active region in the first substrate 10. The formation of the device isolation layer 11 may include forming a trench in an upper portion of the first substrate 10 and filling the trench with a silicon oxide layer.

The peripheral transistors PTR may be formed on the active region defined by the device isolation layer 11. The peripheral contact plugs 31 and the peripheral circuit lines 33 may be formed to be connected to the peripheral source/drain regions 29 of the peripheral transistors PTR. The peripheral circuit insulating layer 30 may be formed to cover the peripheral transistors PTR, the peripheral contact plugs 31, and the peripheral circuit lines 33.

The second substrate 100 may be formed on the peripheral circuit insulating layer 30. The second substrate 100 may be extended from the cell array region CAR (e.g., see FIG. 5) toward the contact region CCR and may be extended from the cell array region CAR (e.g., see FIG. 5) toward the peripheral region PR.

Figure 10:
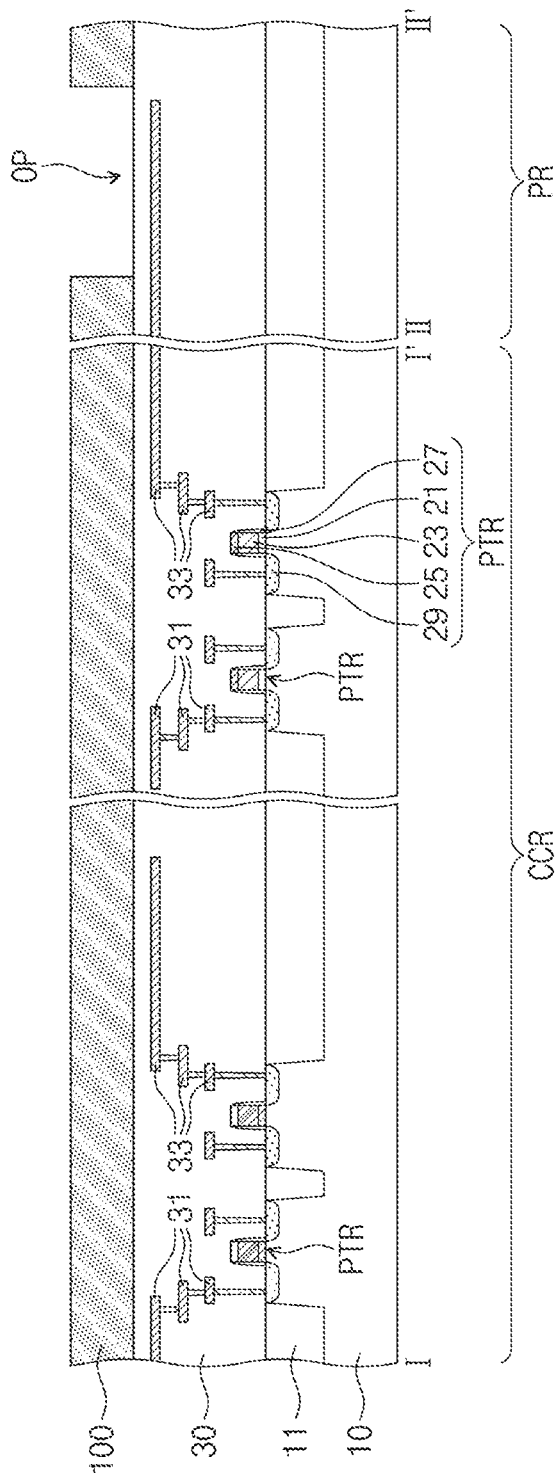

Referring to FIG. 10, an opening OP may be formed by removing a portion of the second substrate 100 on the peripheral region PR, e.g., to expose an upper surface of peripheral circuit insulating layer 30. The formation of the opening OP may include forming a mask pattern to cover the cell array region CAR (e.g., see FIG. 5), the contact region CCR, and at least a portion of the peripheral region PR, and patterning the second substrate 100 using the mask pattern as a patterning mask. In an embodiment, a width of the opening OP in the horizontal direction may range from about 50 μm to 500 μm.

Figure 11:
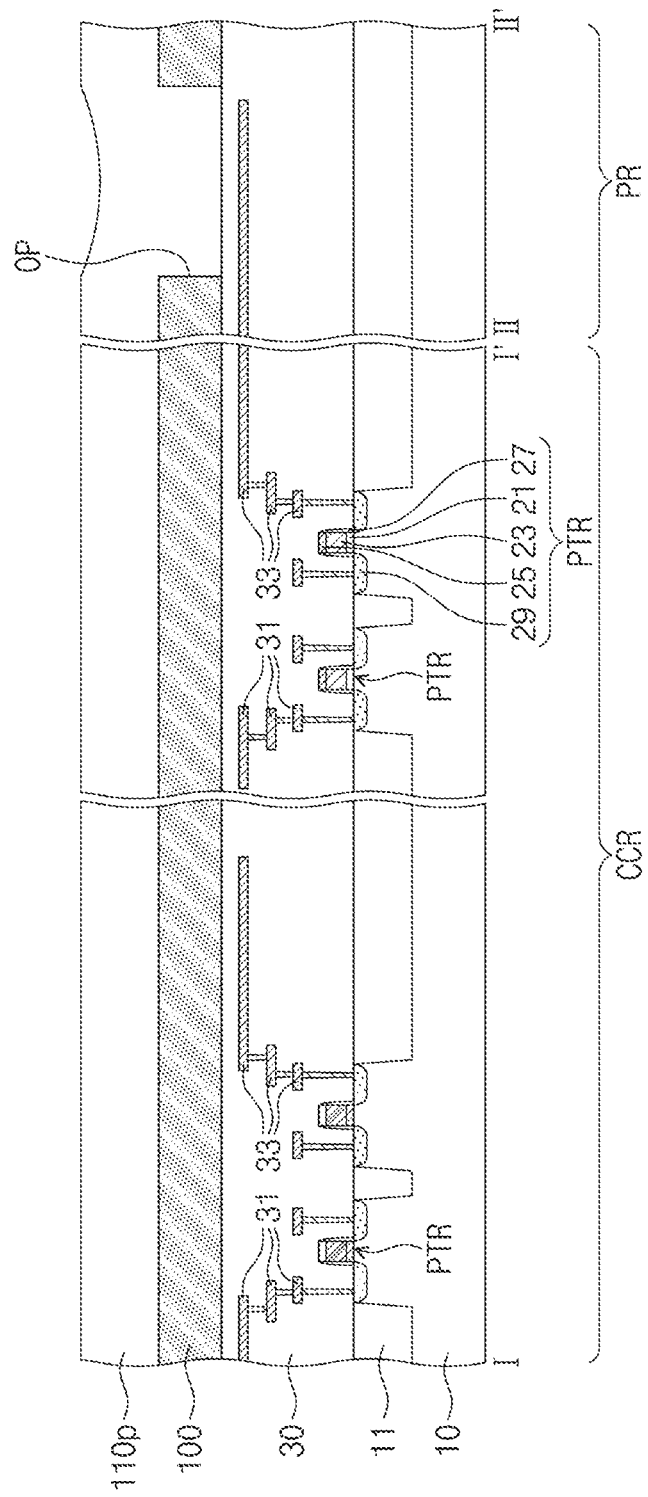

Referring to FIG. 11, a preliminary lower insulating layer 110p may be formed to fill the opening OP. The preliminary lower insulating layer 110p may be formed to fill the opening OP and to fully cover the top surface of the second substrate 100. A portion of a top surface of the preliminary lower insulating layer 110p, which is located on the peripheral region PR and is vertically overlapped with the opening OP, may have a concave profile, e.g., due to the opening OP.

Figure 12:
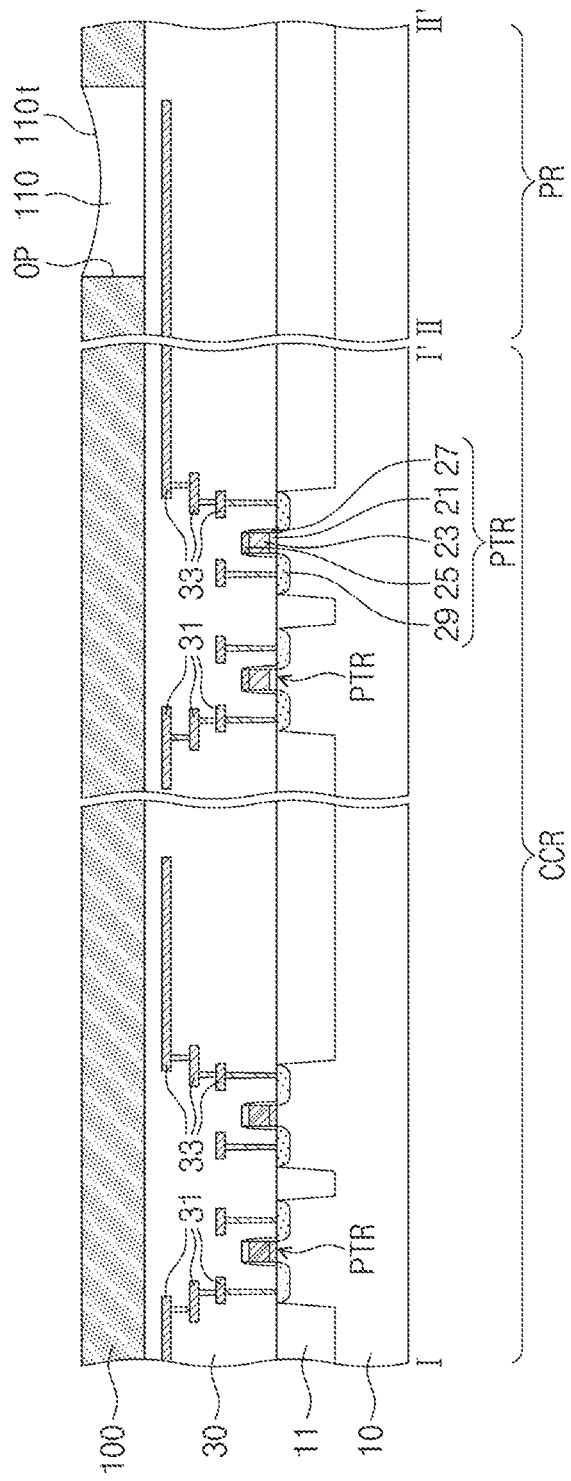

Referring to FIG. 12, a planarization process may be performed to expose the top surface of the second substrate 100. The planarization process may be performed using, e.g., a chemical mechanical polishing (CMP) process or an etch-back process.

After the planarization process, the lower insulating layer 110 may be left in the opening OP. A top surface 110t of the lower insulating layer 110, which is left in the opening OP, may have a concave profile. The concave profile of the top surface 110t of the lower insulating layer 110 may result from a dishing phenomenon, in which the lower insulating layer 110 placed in the opening OP is partially etched during the planarization process.

Figure 13:
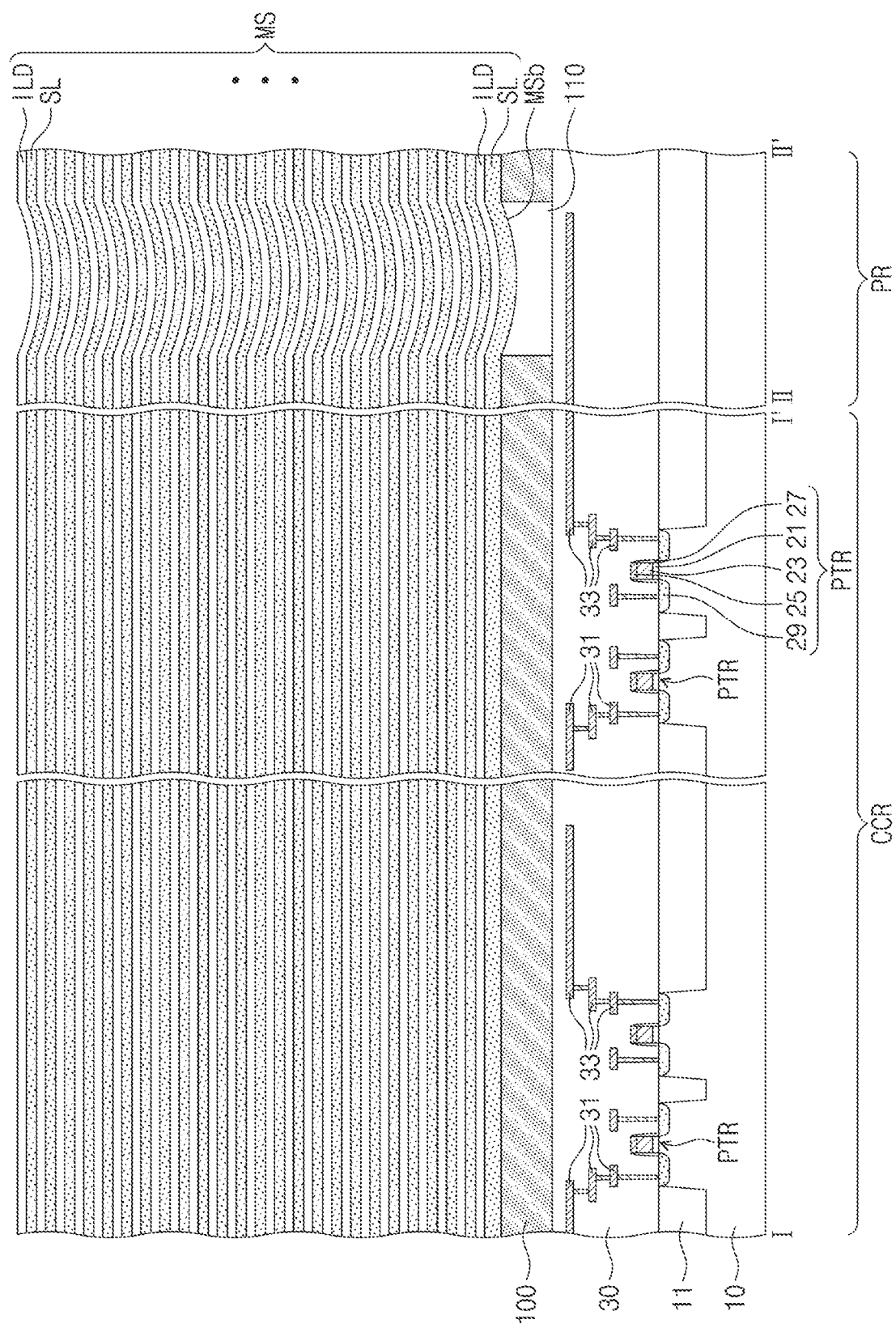

Referring to FIG. 13, the mold structure MS may be formed on the second substrate 100 and the lower insulating layer 110. The mold structure MS may be formed by alternately stacking the sacrificial layers SL and the interlayer dielectric layers ILD on the second substrate 100 and the lower insulating layer 110. The sacrificial layers SL may be formed of or include an insulating material different from the interlayer dielectric layers ILD. The sacrificial layers SL may be formed of or include a material having an etch selectivity with respect to the interlayer dielectric layers ILD. For example, the sacrificial layers SL may be formed of or include silicon nitride, and the interlayer dielectric layers ILD may be formed of or include silicon oxide. The sacrificial layers SL may be formed to have substantially the same thickness, and at least one of the interlayer dielectric layers ILD may have a thickness different from the others.

Due to the dishing phenomenon described with reference to FIG. 12, at least a portion of each of the interlayer dielectric layers ILD and the sacrificial layers SL of the mold structure MS may be bent toward the lower insulating layer 110. In other words, at least a portion of the bottom surface MSb of the mold structure MS may have a profile that is convex toward the first substrate 10, e.g., a portion of the mold structure MS that vertically overlaps the concave profile of the lower insulating layer 110 may trace the concave profile of the lower insulating layer 110 to have a convex profile complementary to the concave profile of the lower insulating layer 110. In addition, the top surface of the uppermost one of the interlayer dielectric layers ILD of the mold structure MS may have a concave profile, similar to the top surface 110t of the lower insulating layer 110.

Figure 14:
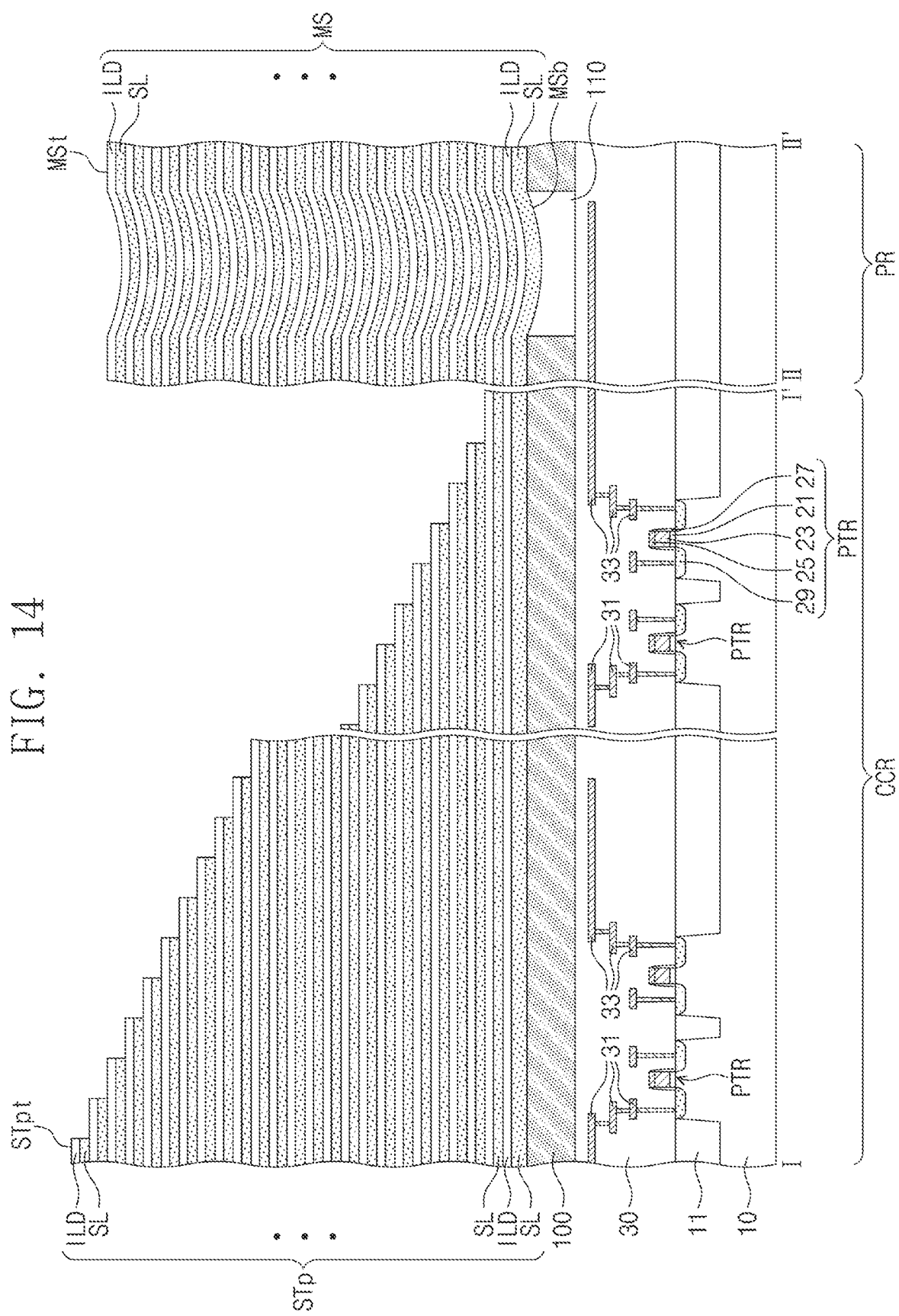

Referring to FIGS. 13 and 14, a trimming process may be performed on the mold structure MS, which is formed on the contact region CCR. The trimming process may include forming a mask pattern to cover a portion of the mold structure MS in the cell array region CAR (e.g., see FIG. 5) and the contact region CCR, patterning the mold structure MS using the mask pattern as a patterning mask, reducing an area of the mask pattern, and patterning the mold structure MS using the mask pattern having the reduced area. In an embodiment, the steps of reducing the area of the mask pattern and patterning the mold structure MS using the mask pattern may be alternately repeated several times during the trimming process. As a result of the trimming process, a preliminary stack STp having a staircase structure may be formed on the contact region CCR.

The mold structure MS, which is located on the peripheral region PR, may be partially etched during the afore-described trimming process. For example, such a partial etching of the mold structure MS may be achieved by forming the mask pattern to expose the mold structure MS of the peripheral region PR in at least one of the several processes, which are performed to form the mold structure MS. As a result, the top surface MSt of the mold structure MS on the peripheral region PR may be located at a level that is lower than the topmost surface STpt of the preliminary stack STp, after the trimming process.

Referring to FIG. 14 in conjunction with FIG. 6, the planarization insulating layer 130 may be formed to cover the staircase structure of the preliminary stack STp on the contact region CCR and the top surface MSt of the mold structure MS on the peripheral region PR. The formation of the planarization insulating layer 130 may include forming an insulating layer to cover the staircase structure of the preliminary stack STp and the top surface MSt of the mold structure MS and performing a planarization process to expose the top surface STpt of the preliminary stack STp. The top surface 130t of the planarization insulating layer 130 may be substantially coplanar with the top surface STpt of the preliminary stack STp and may be located at a level higher than the top surface MSt of the mold structure MS.

Next, after the planarization insulating layer 130 is planarized to have the flat top surface 130t, e.g., after any curved and non-flat portions due to dishing are removed during the planarization, the vertical channel holes CH and the vertical channel structures VS in the vertical channel holes CH may be formed to have the structure described with reference to FIG. 7. Thereafter, separation trenches may be formed to cross the preliminary stack STp. The sacrificial layers SL of the preliminary stack STp exposed by the separation trenches may be selectively removed. In an embodiment, the selective removal of the sacrificial layers SL may be performed by a wet etching process using an etching solution, which contains hydrofluoric acid or phosphoric acid. The source structure SC and the gate electrodes EL may be formed to fill regions, which are formed by removing the sacrificial layers SL, and as a result, the stack ST including the gate electrodes EL and the interlayer dielectric layers ILD may be formed. Next, the separation structures 3230 (e.g., of FIG. 3) may be formed to fill the separation trenches.

Thereafter, the cell contact plugs CP described with reference to FIG. 7 and the through vias THV described with reference to FIG. 8 may be formed. In addition, the upper insulating layer 170 may be formed to cover the stack ST and the planarization insulating layer 130.

Figure 15:
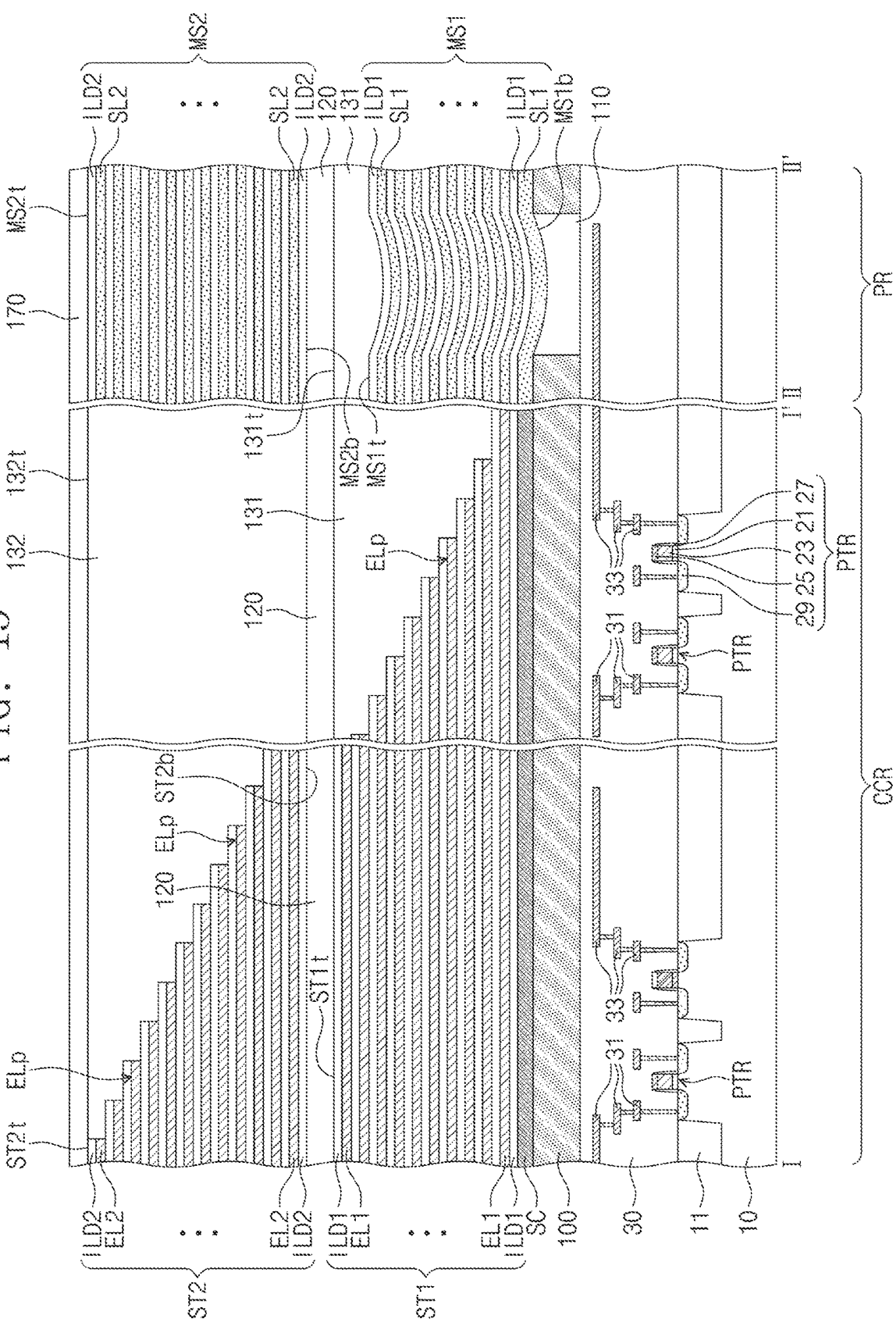
FIGS. 15, 16, and 20 are cross-sectional views of a three-dimensional semiconductor memory device according to an embodiment.

FIG. 15 is a cross-sectional view of a three-dimensional semiconductor memory device according to an embodiment. FIG. 15 illustrates cross-sectional views along lines I-I' and II-II' of FIG. 5. In the following description, overlapping descriptions of same elements will not be repeated.

Referring to FIG. 15, a first stack ST1 and a second stack ST2 may be provided on the second substrate 100 and on the cell array region CAR (e.g., see FIG. 5) and the contact region CCR. The first stack ST1 may be provided between the second substrate 100 and the second stack ST2. The source structure SC may be provided between the second substrate 100 and the first stack ST1.

The first stack ST1 may include first interlayer dielectric layers ILD1 and first gate electrodes ELL which are alternately and repeatedly stacked on the second substrate 100. The second stack ST2 may include second interlayer dielectric layers ILD2 and second gate electrodes EL2, which are alternately and repeatedly stacked on the first stack ST1. The first and second gate electrodes EL1 and EL2 may include the pad portions ELp, which are provided on the contact region CCR to form a staircase structure in the horizontal direction.

A first mold structure MS1 and a second mold structure MS2 may be provided on the lower insulating layer 110 and the second substrate 100 of the peripheral region PR. The first mold structure MS1 may be provided between the second substrate 100 and the second mold structure MS2.

The first mold structure MS1 may include first sacrificial layers SL1 and the first interlayer dielectric layers ILD1, which are alternately and repeatedly stacked on the lower insulating layer 110. The second mold structure MS2 may include second sacrificial layers SL2 and the second interlayer dielectric layers ILD2, which are alternately and repeatedly stacked on the first mold structure MS1.

A first upper insulating layer 120 may be provided between the first and second stacks ST1 and ST2. In an embodiment, the first upper insulating layer 120 may be extended from a region between the first and second stacks ST1 and ST2 to a region between the first and second mold structures MS1 and MS2 in the horizontal direction. The first upper insulating layer 120 may be formed of or include at least one of, e.g., silicon oxide, silicon nitride, silicon oxynitride, and/or low-k dielectric materials.

A first planarization insulating layer 131 may be provided between the first upper insulating layer 120 and the first stack ST1 and between the first upper insulating layer 120 and the first mold structure MS1. The first planarization insulating layer 131 may cover the pad portions ELp of the first gate electrodes EL1 and the uppermost one of the first interlayer dielectric layers ILD1 of the first mold structure MS1.

A top surface 131t of the first planarization insulating layer 131 may be substantially coplanar with the bottom surface of the first upper insulating layer 120 and the topmost surface ST1t of the first stack ST1. The top surface 131t of the first planarization insulating layer 131 may be located at a level that is higher than a top surface MS1t of the first mold structure MS1. The first and second mold structures MS1 and MS2 may be spaced apart from each other in the vertical direction, with the first upper insulating layer 120 and the first planarization insulating layer 131 interposed therebetween.

A second planarization insulating layer 132 may be provided on the second stack ST2 and the first upper insulating layer 120. The second planarization insulating layer 132 may cover the pad portions ELp of the second gate electrodes EL2 and the top surface of the first upper insulating layer 120.

A bottom surface of the second planarization insulating layer 132 may be substantially coplanar with the top surface of the first upper insulating layer 120, a bottom surface ST2b of the second stack ST2, and a bottom surface MS2b of the second mold structure MS2. A top surface 132t of the second planarization insulating layer 132 may be substantially coplanar with the topmost surface ST2t of the second stack ST2 and a top surface MS2t of the second mold structure MS2. In an embodiment, the top surface MS2t and the bottom surface MS2b of the second mold structure MS2 may be parallel to the top surface of the first substrate 10 and may be substantially flat. By etching an upper portion of the first mold structure MS1, as described with reference to FIG. 14, it may be possible to prevent the profile of the top surface of the lower insulating layer 110 from being transcribed to the top surface MS2t and the bottom surface MS2b of the second mold structure MS2.

The three-dimensional semiconductor memory device according to the embodiment of FIG. 15 may include the vertical channel holes CH and the vertical channel structures VS described with reference to FIG. 7. In the three-dimensional semiconductor memory device according to the embodiment of FIG. 15, each of the vertical channel holes CH may include a first vertical channel hole penetrating the first stack ST1 and a second vertical channel hole penetrating the second stack ST2.

Each of the first and second vertical channel holes may have a width increasing with increasing distance from the second substrate 100. The first and second vertical channel holes may be connected to each other. A bottom diameter of the second vertical channel hole may be smaller than a top diameter of the first vertical channel hole, and thus, the first and second vertical channel holes may form a stepwise structure near a boundary therebetween. However, embodiments are not limited to this example, and in an embodiment, the vertical channel hole CH may be composed of three or more vertical channel holes, which are formed to have the stepwise structure at two or more different levels, or may be composed of a single vertical channel hole whose side surface is substantially flat without such a stepwise structure. In this case, the vertical channel structure VS may have a vertical section that corresponds to the vertical channel hole CH.

Figure 16:
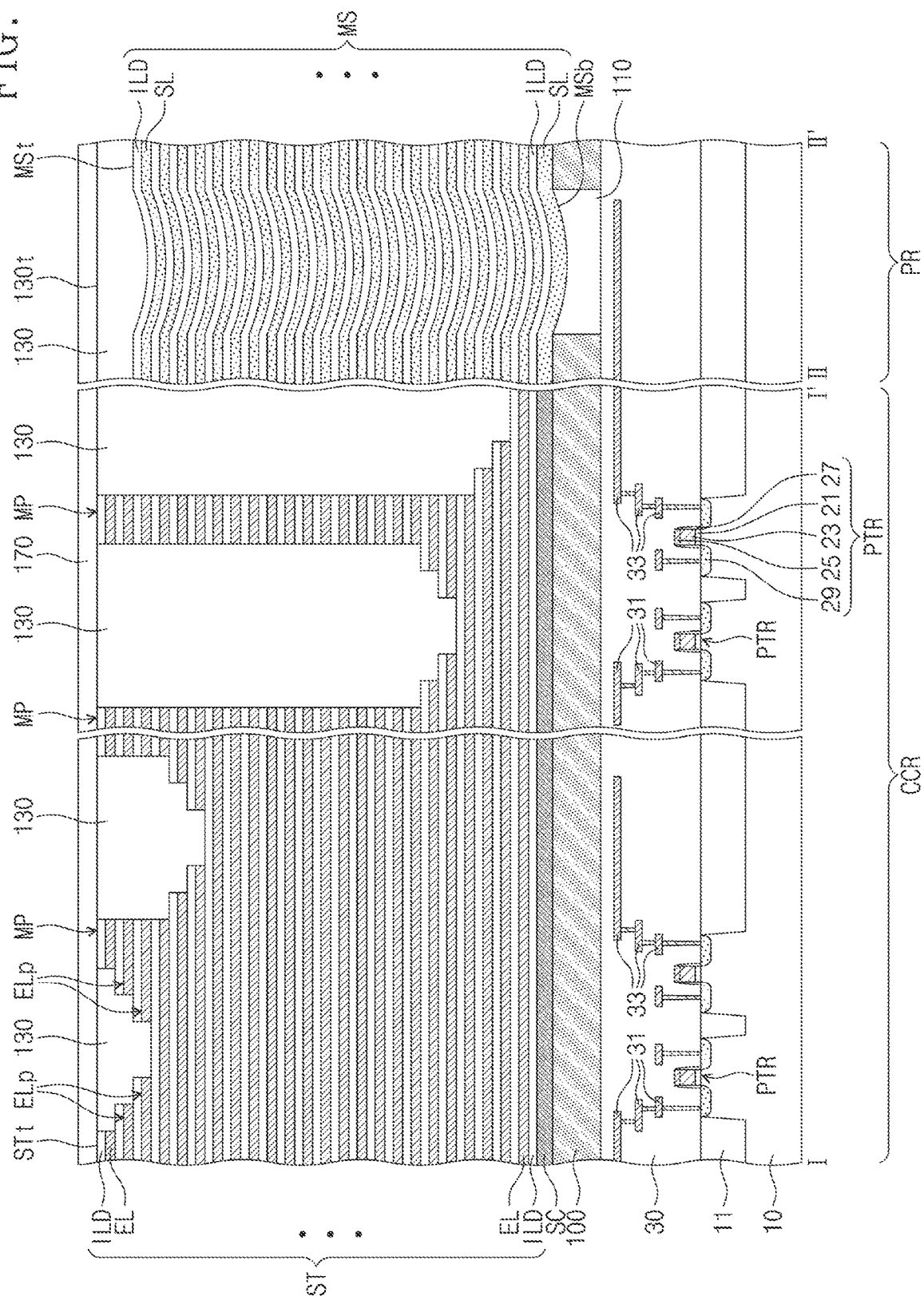

FIG. 16 is a cross-sectional view of a three-dimensional semiconductor memory device according to an embodiment. FIG. 16 illustrates cross-sectional views along lines I-I' and II-II' of FIG. 5. In the following description, overlapping descriptions of same elements will not be repeated.

Referring to FIG. 16, the stack ST may include mold pillars MP, which are extended in the vertical direction and are in contact with a bottom surface of the upper insulating layer 170. Heights of the mold pillars MP may increase with increasing distance from the cell array region CAR (e.g., see FIG. 5).

The planarization insulating layers 130 may be provided to fill spaces between the mold pillars MP. The mold pillars MP may be spaced apart from each other in the horizontal direction, with the planarization insulating layers 130 interposed therebetween. A level of a bottom surface of each of the planarization insulating layers 130 between the mold pillars MP may be lowered with increasing distance from the cell array region CAR (e.g., see FIG. 5). A top surface of each of the planarization insulating layers 130 may be substantially coplanar with a top surface of each of the mold pillars MP.

The gate electrodes EL of the stack ST may form staircase structures, which are extended to face each other between the mold pillars MP. More specifically, levels of the pad portions ELp of the gate electrodes EL may be lowered with increasing distance from each of the mold pillars MP. The pad portions ELp of the gate electrodes EL, which face each other with one of the planarization insulating layers 130 interposed therebetween, may be located at the same level.

Figure 17:
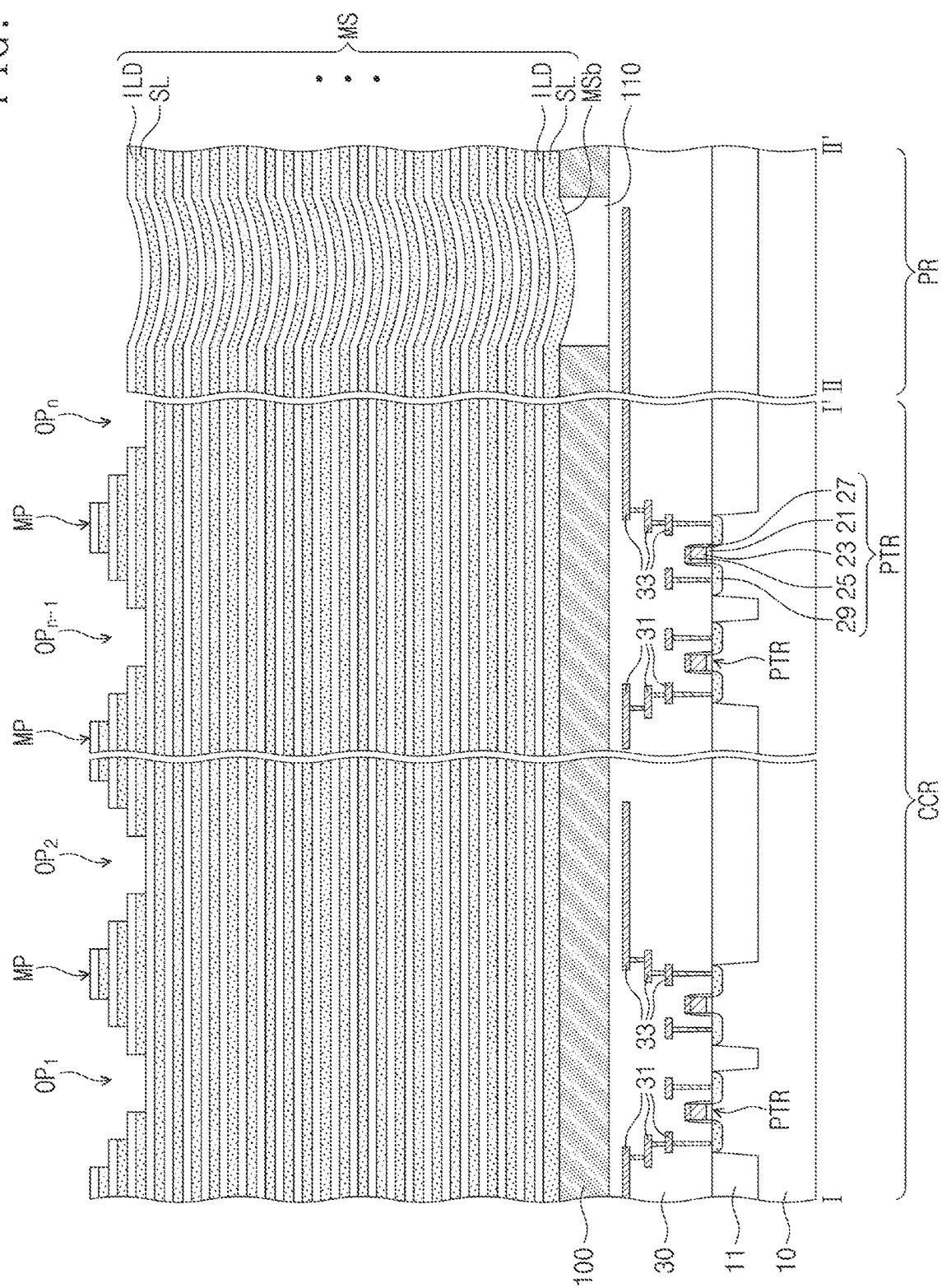
FIGS. 17 to 19 are cross-sectional views of stages in a method of fabricating the three-dimensional semiconductor memory device of FIG. 16.
Figure 18:
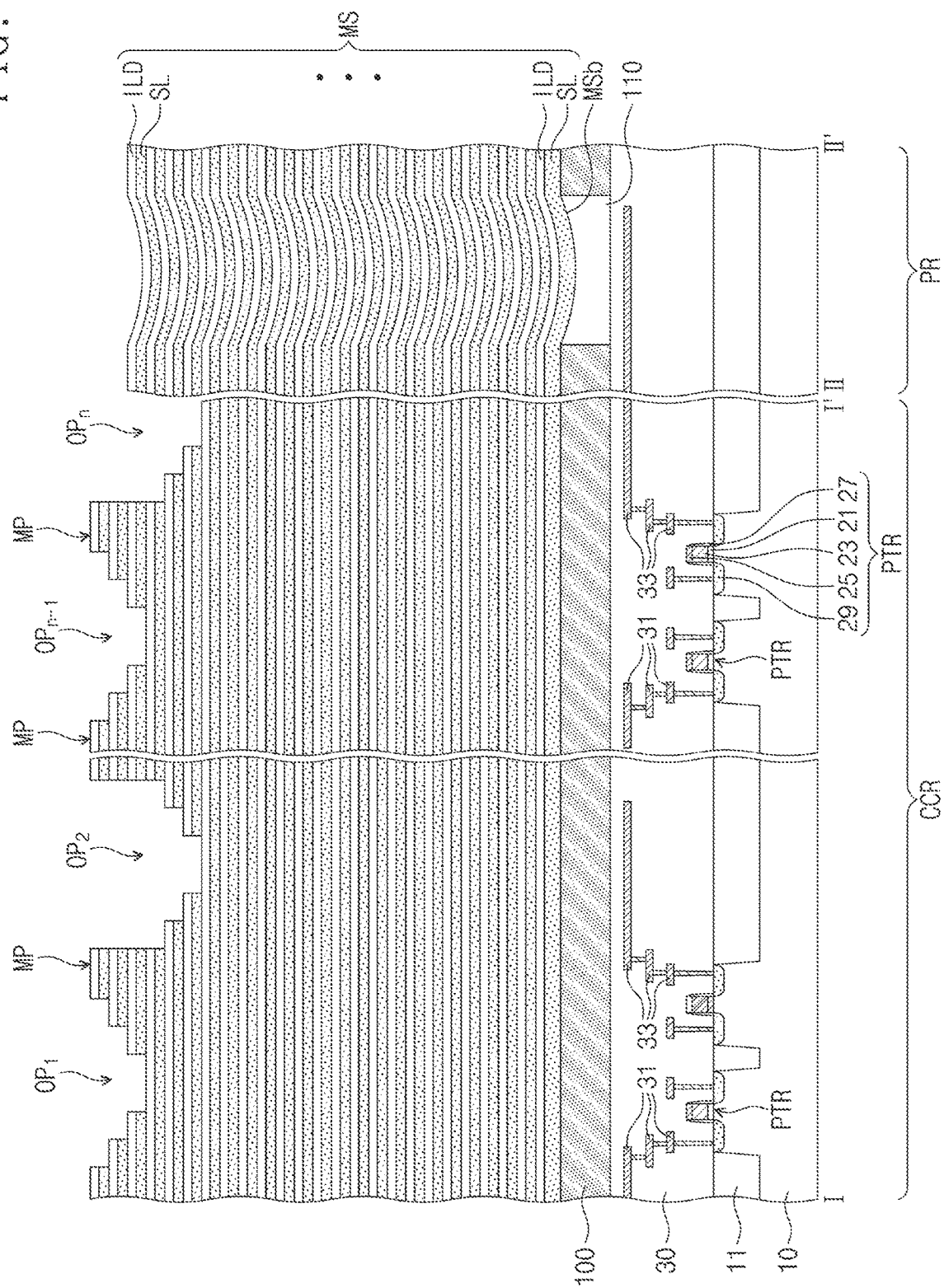
Figure 19:
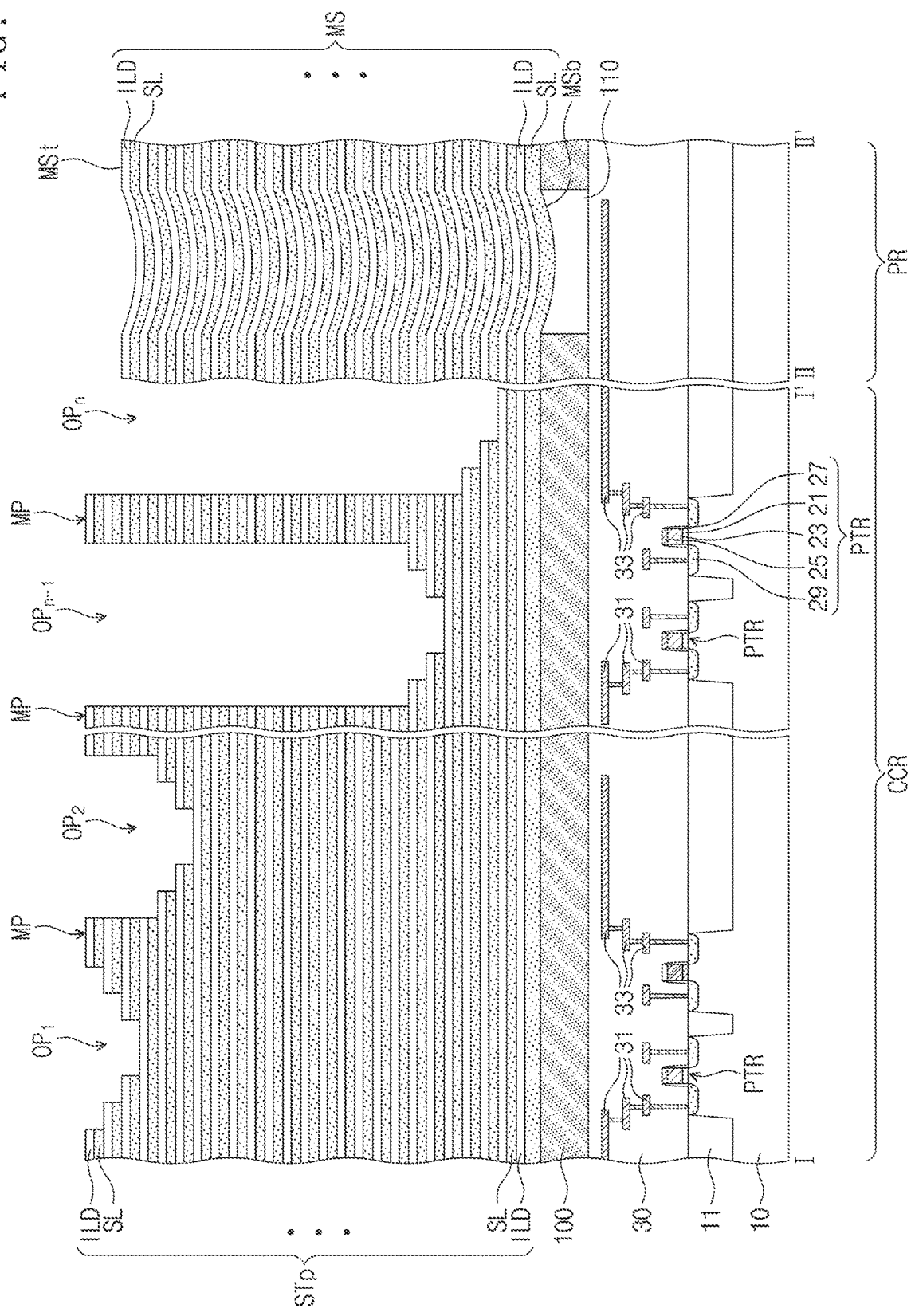

FIGS. 17 to 19 are sectional views of stages in a method of fabricating the three-dimensional semiconductor memory device of FIG. 16. FIGS. 17 to 19 correspond to lines I-I' and II-II' of FIG. 5. Hereinafter, the fabrication method will be described in more detail with reference to FIGS. 16 to 19.

After the fabrication process described with reference to FIGS. 9 to 13, an etching process may be performed on the mold structure MS on the contact region CCR.

Referring to FIGS. 13 and 17, a first etching process may be performed on the mold structure MS on the contact region CCR. In an embodiment, the first etching process may be performed to form openings $OP_1$, $OP_2$, ..., $OP_{n-1}$, and $OP_n$, which penetrate some layers of the mold structure MS. The first etching process may be performed using the afore-described trimming process.

More specifically, the first etching process may include forming a plurality of mask patterns to cover portions of the mold structure MS and to expose other portions, etching the exposed portions of the mold structure MS using the mask patterns as an etching mask, reducing an area of each of the mask patterns, and etching other portions of the mold structure MS using the mask patterns having the reduced areas. Here, the etching of the mold structure MS may be performed to etch the uppermost two layers (i.e., one interlayer dielectric layer ILD and one sacrificial layer SL) of the mold structure MS, which are exposed through the mask patterns. In an embodiment, the steps of reducing the area of the mask pattern and patterning the mold structure MS using the mask pattern may be alternately repeated several times during the first etching process.

As a result of the first etching process, the mold pillars MP may be formed between the openings $OP_1$, $OP_2$, ..., $OP_{n-1}$, and $OP_n$. The mold pillars MP may be portions of the mold structure MS, which have been uninterruptedly veiled by the mask patterns during the repetition of the patterning process.

Referring to FIG. 18, a second etching process may be performed on the mold structure MS on the contact region CCR. In an embodiment, the second etching process may be performed to increase depths of some of the openings $OP_1$, $OP_2$, ..., $OP_{n-1}$, and $OP_n$. For example, the second etching process may be performed on the even-numbered openings $OP_2$, $OP_4$, ..., $OP_n$ (where n=2k and k is a natural number). Here, the numbering of the openings $OP_1$, $OP_2$, $OP_{n-1}$, and $OP_n$ may be based on the distance from the cell array region CAR (e.g., see FIG. 5), but embodiments are not limited to this numbering method. The second etching process may be performed using the trimming process described with reference to FIG. 17.

More specifically, the second etching process may include forming first mask patterns to cover the odd-numbered openings $OP_1$, $OP_3$, ..., $OP_{n-1}$ (where n=2k and k is a natural number) and forming second mask patterns to cover the mold pillars MP, etching exposed portions of the mold structure MS using the first and second mask patterns as an etching mask, reducing an area of each of the second mask patterns, and etching other portions of the mold structure MS using the second mask patterns having the reduced areas. In an embodiment, the steps of reducing the areas of the second mask patterns and patterning the mold structure MS using the second mask patterns may be alternately repeated several times during the second etching process. An etching amount in the second etching process may be greater than an etching amount in the first etching process.

The second mask patterns may cover at least a portion of the even-numbered openings $OP_2$, $OP_4$, ..., $OP_n$ (where n=2k and k is a natural number) while the areas of the second mask patterns are reduced. The mold pillars MP may be uninterruptedly veiled by the second mask patterns, during the repetition of the patterning process.

Referring to FIG. 19, the preliminary stack STp may be formed by performing etching processes (e.g., third to n-th etching processes) on some of the openings $OP_1$, $OP_2$, ..., $OP_{n-1}$, and $OP_n$ in the same manner as described with reference to FIGS. 17 and 18. Mask patterns, which are formed to cover some of the openings $OP_1$, $OP_2$, ..., $OP_{n-1}$, and $OP_n$, may be used in each of the etching processes. An etching amount in each of the etching processes may be greater than an etching amount in a previously-performed etching process. Depths of the openings $OP_1$, $OP_2$, ..., $OP_{n-1}$, and $OP_n$ and heights of the mold pillars MP between the openings $OP_1$, $OP_2$, ..., $OP_{n-1}$, and $OP_n$ may increase with increasing distance from the cell array region CAR (e.g., see FIG. 5).

In one of the first to n-th etching processes, the mask pattern may not be formed on the mold structure MS on the peripheral region PR, and thus, an upper portion of the mold structure MS on the peripheral region PR may be partially removed. However, the mold structure MS on the peripheral region PR may be veiled by the mask pattern in the others of the etching processes, except for such an etching process of exposing the mold structure MS on the peripheral region PR.

Referring to FIG. 19 in conjunction with FIG. 16, the planarization insulating layers 130 may be formed to cover the preliminary stack STp on the contact region CCR and the mold structure MS on the peripheral region PR. The formation of the planarization insulating layers 130 may include forming an insulating layer to cover the staircase structure of the preliminary stack STp and the mold structure MS and performing a planarization process to expose the top surface STpt of the preliminary stack STp and the top surfaces of the mold pillars MP. The top surface 130t of each of the planarization insulating layers 130 may be substantially coplanar with the top surface STpt of the preliminary stack STp and the top surfaces of the mold pillars MP and may be located at a level that is higher than the top surface MSt of the mold structure MS on the peripheral region PR.

Figure 20:
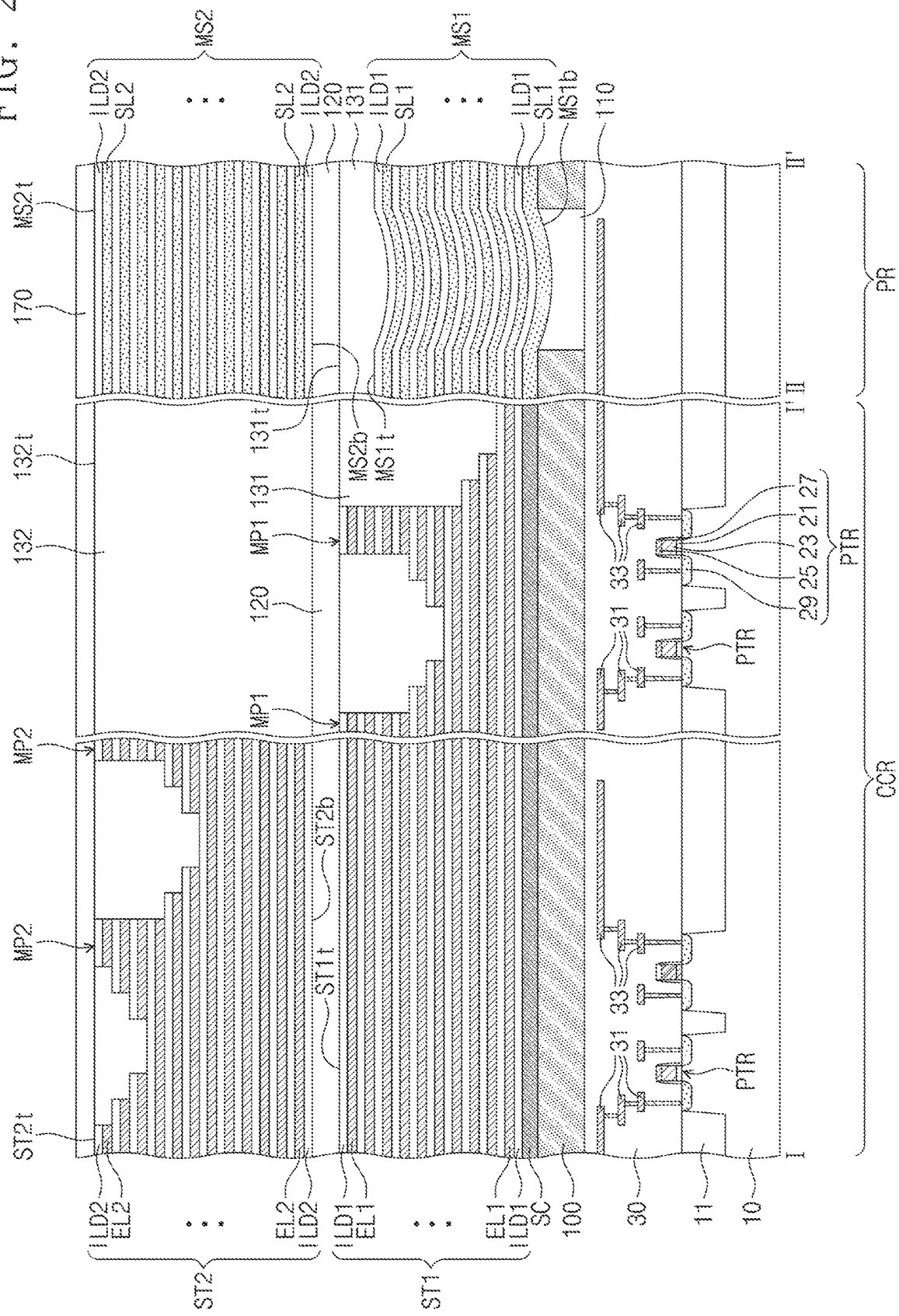

FIG. 20 is a cross-sectional view of a three-dimensional semiconductor memory device according to an embodiment. FIG. 20 corresponds to cross-sections along lines I-I' and II-II' of FIG. 5. In the following description, overlapping descriptions of same elements will not be repeated.

Referring to FIG. 20, the first stack ST1 and the second stack ST2 may be provided on the second substrate 100 and on the cell array region CAR (e.g., see FIG. 5) and the contact region CCR. The first stack ST1 may be provided between the second substrate 100 and the second stack ST2. The source structure SC may be provided between the second substrate 100 and the first stack ST1.

The first stack ST1 may include first mold pillars MP1, which are extended in the vertical direction and are in contact with a bottom surface of the first upper insulating layer 120. Heights of the first mold pillars MP1 may increase with increasing distance from the cell array region CAR (e.g., see FIG. 5). The first planarization insulating layers 131 may be provided to fill a space between the first mold pillars MP1.

The top surface 131t of each of the first planarization insulating layers 131 may be substantially coplanar with the topmost surface ST1t of the first stack ST1, the top surfaces of the first mold pillars MP1, and the bottom surface of the first upper insulating layer 120 and may be located at a level higher than the top surface MS1t of the first mold structure MS1.

The second stack ST2 may include second mold pillars MP2, which are extended in the vertical direction and are in contact with a bottom surface of the second upper insulating layer 170. The second mold pillars MP2 may be spaced apart from the first mold pillars MP1 of the first stack ST1, when viewed in a plan view. In other words, the second mold pillars MP2 may not be overlapped with the first mold pillars MP1 in the vertical direction. Heights of the second mold pillars MP2 may increase with increasing distance from the cell array region CAR (e.g., see FIG. 5). The second planarization insulating layers 132 may be provided to fill a space between the second mold pillars MP2 and to cover the first upper insulating layer 120.

The top surface 132*t* of each of the second planarization insulating layers 132 may be substantially coplanar with the topmost surface ST2*t* of the second stack ST2, the top surfaces of the second mold pillars MP2, the bottom surface of the second upper insulating layer 170, and the top surface MS2*t* of the second mold structure MS2.

By way of summation and review, embodiments provide a three-dimensional semiconductor memory device with improved electrical characteristics and reliability and a method of fabricating the same. Embodiments also provide an electronic system including the three-dimensional semiconductor memory device.

That is, an method of fabricating a three-dimensional semiconductor memory device according to an embodiment, it may be possible to prevent a concave profile of a top surface of a lower insulating layer, which is caused by a dishing phenomenon, from being transcribed to a top surface of a planarization insulating layer, and thus, in a process of filling vertical channel holes on a contact region with a semiconductor material and planarizing the semiconductor material, it may be possible to prevent the semiconductor material from being left on a peripheral region. Accordingly, it may be possible to prevent through vias on the peripheral region from being undesirably connected to each other by a remaining portion of the semiconductor material and thereby to improve electrical characteristics and reliability of a three-dimensional semiconductor memory device.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A three-dimensional semiconductor memory device, comprising:
   a first substrate;
   a peripheral circuit structure with peripheral transistors on the first substrate;
   a second substrate on the peripheral circuit structure;
   a lower insulating layer in contact with a side surface of the second substrate, a top surface of the lower insulating layer having a concave profile;
   a first stack on the second substrate, the first stack including repeatedly alternating first interlayer dielectric layers and first gate electrodes; and
   a first mold structure on the lower insulating layer, the first mold structure including repeatedly alternating first sacrificial layers and second interlayer dielectric layers, and a top surface of the first mold structure being at a level lower than a topmost surface of the first stack.

2. The device as claimed in claim 1, wherein the first substrate includes:
   a cell array region;
   a contact region extending from the cell array region in a first direction the first stack extending from the cell array region to the contact region; and
   a peripheral region adjacent to the cell array region and the contact region in a second direction crossing the first direction, the first mold structure being on the peripheral region.

3. The device as claimed in claim 1, wherein at least a portion of the first mold structure is bent toward the lower insulating layer, in accordance with the top surface of the lower insulating layer, the first mold structure overlapping the second substrate in a horizontal direction.

4. The device as claimed in claim 1, further comprising a first planarization insulating layer covering the first stack and the first mold structure, a top surface of the first planarization insulating layer being coplanar with the topmost surface of the first stack and is at a level higher than the top surface of the first mold structure.

5. The device as claimed in claim 4, further comprising through vias, each of the through vias penetrating the first planarization insulating layer, the first mold structure, and the lower insulating layer, and each of the through vias being electrically connected to at least one of the peripheral transistors of the peripheral circuit structure.

6. The device as claimed in claim 4, wherein the first planarization insulating layer includes a first portion overlapping the first mold structure in a vertical direction, a largest thickness of the first portion being larger than a difference in level between a highest point and a lowest point of the top surface of the first mold structure.

7. The device as claimed in claim 4, further comprising:
   a first upper insulating layer on the first stack;
   a second stack on the first stack, the second stack including repeatedly alternating third interlayer dielectric layers and second gate electrodes;
   a second mold structure on the first mold structure, the second mold structure including repeatedly alternating second sacrificial layers and fourth interlayer dielectric layers;
   a second planarization insulating layer covering the second stack; and
   a second upper insulating layer covering the second stack, the second mold structure, and the second planarization insulating layer.

8. The device as claimed in claim 7, wherein a top surface of the second planarization insulating layer is coplanar with a topmost surface of the second stack and a top surface of the second mold structure.

9. The device as claimed in claim 7, wherein the second mold structure is spaced apart from the first mold structure in a vertical direction, with the first planarization insulating layer and the first upper insulating layer being therebetween.

10. The device as claimed in claim 4, wherein the first stack includes first mold pillars extending in a vertical direction, a top surface of each of the first mold pillars being coplanar with the top surface of the first planarization insulating layer.

11. The device as claimed in claim 10, wherein the first substrate includes:
a cell array region;
a contact region extending from the cell array region in a first direction, the first mold pillars being on the contact region, and a height of the first mold pillars increasing with increasing distance from the cell array region, and
a peripheral region adjacent to the cell array region and the contact region in a second direction crossing the first direction.

12. The device as claimed in claim 10, wherein:
the first mold pillars are spaced apart from each other in a horizontal direction, with the first planarization insulating layer interposed therebetween, and
the first gate electrodes of the first stack are arranged in staircase structures extended to face each other between the first mold pillars.

13. The device as claimed in claim 10, further comprising:
a first upper insulating layer on the first stack;
a second stack on the first stack, the second stack including:
repeatedly alternating third interlayer dielectric layers and second gate electrodes, and
second mold pillars extending in the vertical direction;
a second mold structure on the first mold structure, the second mold structure including repeatedly alternating second sacrificial layers and fourth interlayer dielectric layers;
a second planarization insulating layer covering the second stack, a top surface of each of the second mold pillars of the second stack being coplanar with a top surface of the second planarization insulating layer; and
a second upper insulating layer covering the second stack, the second mold structure, and the second planarization insulating layer.

14. The device as claimed in claim 13, wherein the second mold pillars are spaced apart from the first mold pillars.

15. The device as claimed in claim 1, wherein at least a portion of the top surface of the lower insulating layer is at a level lower than a top surface of the second substrate.

16. A three-dimensional semiconductor memory device, comprising:
a first substrate including a cell array region, a contact region, and a peripheral region;
a peripheral circuit structure with peripheral transistors on the first substrate;
a second substrate on the peripheral circuit structure and extended from the cell array region to the contact region;
a lower insulating layer on the peripheral region, the lower insulating layer being in contact with a side surface of the second substrate;
a stack on the second substrate, the stack including repeatedly alternating first interlayer dielectric layers and gate electrodes;
a source structure extending in a horizontal direction between the second substrate and the stack;
a mold structure on the lower insulating layer, the mold structure including repeatedly alternating sacrificial layers and second interlayer dielectric layers, and the mold structure having a concave top surface on the peripheral region;
a planarization insulating layer covering the stack and the mold structure, the concave top surface of the mold structure being at a level lower than a topmost surface of the stack and a top surface of the planarization insulating layer;
vertical channel structures on the cell array region and the contact region, the vertical channel structures penetrating the planarization insulating layer, the stack, and the source structure and are in contact with the second substrate;
cell contact plugs on the contact region, the cell contact plugs penetrating the planarization insulating layer and are in contact with respective ones of the gate electrodes of the stack; and
through vias on the peripheral region, the through vias penetrating the planarization insulating layer, the mold structure, and the lower insulating layer and are electrically connected to the peripheral transistors of the peripheral circuit structure.

17. The device as claimed in claim 16, wherein:
the stack includes mold pillars on the contact region, the mold pillars extending in a vertical direction,
a top surface of each of the mold pillars is coplanar with the top surface of the planarization insulating layer, and
heights of the mold pillars increase with increasing distance from the cell array region.

18. The device as claimed in claim 17, wherein:
the vertical channel structures extend in vertical channel holes, respectively, the vertical channel holes penetrating the planarization insulating layer, the stack, the source structure, and at least a portion of the second substrate, and
each of the vertical channel structures includes a data storage pattern, which conformally covers a side surface of each of the vertical channel holes, and a vertical semiconductor pattern, which covers a side surface of the data storage pattern.

19. An electronic system, comprising:
a three-dimensional semiconductor memory device including:
a first substrate,
a peripheral circuit structure on the first substrate,
a second substrate on the peripheral circuit structure,
a lower insulating layer in contact with a side surface of the second substrate, a top surface of the lower insulating layer having a concave profile
a stack on the second substrate,
a mold structure on the lower insulating layer, a top surface of the mold structure being at a level lower than a topmost surface of the stack,
an upper insulating layer on the stack and the mold structure, and
an input/output pad on the upper insulating layer; and
a controller connected to the three-dimensional semiconductor memory device through the input/output pad, the controller being configured to control the three-dimensional semiconductor memory device.

20. The electronic system as claimed in claim 19, wherein the stack includes mold pillars extending in a vertical direction, a top surface of each of the mold pillars being coplanar with a bottom surface of the upper insulating layer.

* * * * *